United States Patent
Choi et al.

(10) Patent No.: US 10,964,740 B2
(45) Date of Patent: Mar. 30, 2021

(54) IMAGE SENSOR

(71) Applicant: Samsung Electronics Co., Ltd., Suwon-si (KR)

(72) Inventors: Jinyong Choi, Seoul (KR); Haemin Lim, Seoul (KR); Joosung Moon, Seoul (KR); Ingyu Baek, Seoul (KR); Seunghan Yoo, Seongnam-si (KR); Minjung Chung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/407,870

(22) Filed: May 9, 2019

(65) Prior Publication Data

US 2020/0111831 A1   Apr. 9, 2020

(30) Foreign Application Priority Data

Oct. 4, 2018 (KR) .................. 10-2018-0118218

(51) Int. Cl.
*H01L 27/146* (2006.01)

(52) U.S. Cl.
CPC .... *H01L 27/14636* (2013.01); *H01L 27/1463* (2013.01); *H01L 27/14621* (2013.01); *H01L 27/14627* (2013.01); *H01L 27/14643* (2013.01)

(58) Field of Classification Search
None
See application file for complete search history.

(56) References Cited

U.S. PATENT DOCUMENTS

| | | |
|---|---|---|
| 7,728,892 B2 | 6/2010 | Altice, Jr. |
| 7,772,536 B2 | 8/2010 | Yamada |
| 8,917,341 B2 | 12/2014 | Sakano |
| 9,142,689 B2 | 9/2015 | Kondo |
| 9,293,496 B2 | 3/2016 | Kashihara |
| 9,337,228 B2 | 5/2016 | Sa |
| 9,484,371 B2 | 11/2016 | Yamashita |
| 9,565,375 B1 | 2/2017 | Raynor |
| 9,793,312 B1 | 10/2017 | Roy |
| 9,947,709 B2 | 4/2018 | Huang |
| 2013/0214371 A1 | 8/2013 | Asatsuma |
| 2015/0054110 A1* | 2/2015 | Kashihara ......... H01L 27/14643 257/435 |
| 2017/0170224 A1* | 6/2017 | Huang ............... H01L 21/8221 |

(Continued)

*Primary Examiner* — Benjamin P Sandvik
(74) *Attorney, Agent, or Firm* — Myers Bigel, P.A

(57) ABSTRACT

An image sensor includes a semiconductor substrate having a first surface and a second surface opposite to the first surface, a photoelectric conversion layer in the semiconductor substrate, transistors on the first surface of the semiconductor substrate, a first interlayer insulation layer on the transistors, a first lower pad electrode and a second lower pad electrode spaced apart from the first lower pad electrode on the first interlayer insulation layer, a mold insulation layer on the first and second lower pad electrodes, first and second lower electrodes in the mold insulation layer, a dielectric layer on the first and second lower electrodes, an upper electrode on the dielectric layer, and an upper pad electrode connected to the upper electrode and including a different conductive material from the first and second lower pad electrodes. The first lower electrodes are on the first lower pad electrode, and the second lower electrodes are on the second lower pad electrode.

19 Claims, 21 Drawing Sheets

(56) References Cited

U.S. PATENT DOCUMENTS

| | | |
|---|---|---|
| 2017/0345854 A1 | 11/2017 | Kwon |
| 2018/0103226 A1 | 4/2018 | Raynor |
| 2019/0267423 A1* | 8/2019 | Lee .................. H01L 27/14621 |
| 2020/0127029 A1* | 4/2020 | Meynants ........... H01L 27/1464 |

* cited by examiner

IMAGE SENSOR

CROSS-REFERENCE TO RELATED APPLICATION

This application claims priority under 35 U.S.C. § 119 to Korean Patent Application No. 10-2018-0118218, filed on Oct. 4, 2018, in the Korean Intellectual Property Office, the disclosure of which is hereby incorporated by reference in its entirety.

TECHNICAL FIELD

Example embodiments of the present disclosure relate to an image sensor, and, more specifically, to an image sensor capable of operating in a global shutter mode.

DISCUSSION OF RELATED ART

An image sensor is a semiconductor device for converting an optical image into an electrical signal. With developments in the computer and communication industries, there is a relatively strong demand for high performance image sensors in various devices, such as a digital camera, a camcorder, a personal communication system (PCS), a game device, a security camera, and/or a medical micro camera. An image sensor for implementing a three-dimensional image as well as a color image has been developed.

SUMMARY

According to example embodiments of the inventive concepts, an image sensor may include a semiconductor substrate having a first surface and a second surface opposite to the first surface, a photoelectric conversion layer in the semiconductor substrate, transistors on the first surface of the semiconductor substrate, a first interlayer insulation layer on the transistors, a first lower pad electrode and a second lower pad electrode spaced apart from the first lower pad electrode on the first interlayer insulation layer, a mold insulation layer on the first and second lower pad electrodes, first and second lower electrodes in the mold insulation layer, a dielectric layer on the first and second lower electrodes, an upper electrode on the dielectric layer, and an upper pad electrode connected to the upper electrode. The first lower electrodes may be on the first lower pad electrode. The second lower electrodes may be on the second lower pad electrode. The upper pad electrode may include a different conductive material from the first and second lower pad electrodes.

According to example embodiments of the inventive concepts, an image sensor may include a semiconductor substrate having a first surface and a second surface opposite to the first surface, a photoelectric conversion layer in the semiconductor substrate, transistors on the first surface of the semiconductor substrate, a first interlayer insulation layer on the transistors, first wiring lines comprising a first metal material on the first interlayer insulation layer and connected to the transistors, a mold insulation layer on the first wiring lines, a capacitor in the mold insulation layer and connected to the transistors, a second interlayer insulation layer on the capacitor, and second wiring lines comprising a second metal material on the second interlayer insulation layer and connected to the first wiring lines and the capacitor. The second metal material of the second wiring lines may have less resistivity than the first metal material of the first wiring lines.

According to example embodiments of the inventive concepts, an image sensor may include a semiconductor substrate having a first surface and a second surface opposite to the first surface, a pixel separation structure in the semiconductor substrate and defining a plurality of pixel regions, a photoelectric conversion layer in the semiconductor substrate in each of the plurality of pixel regions, transistors on the first surface of the semiconductor substrate, a first interlayer insulation layer on the transistors, and a first capacitor and a second capacitor on the first interlayer insulation layer and overlapping the photoelectric conversion layer in each of the plurality of pixel regions.

DETAILED DESCRIPTION

Figure 1:
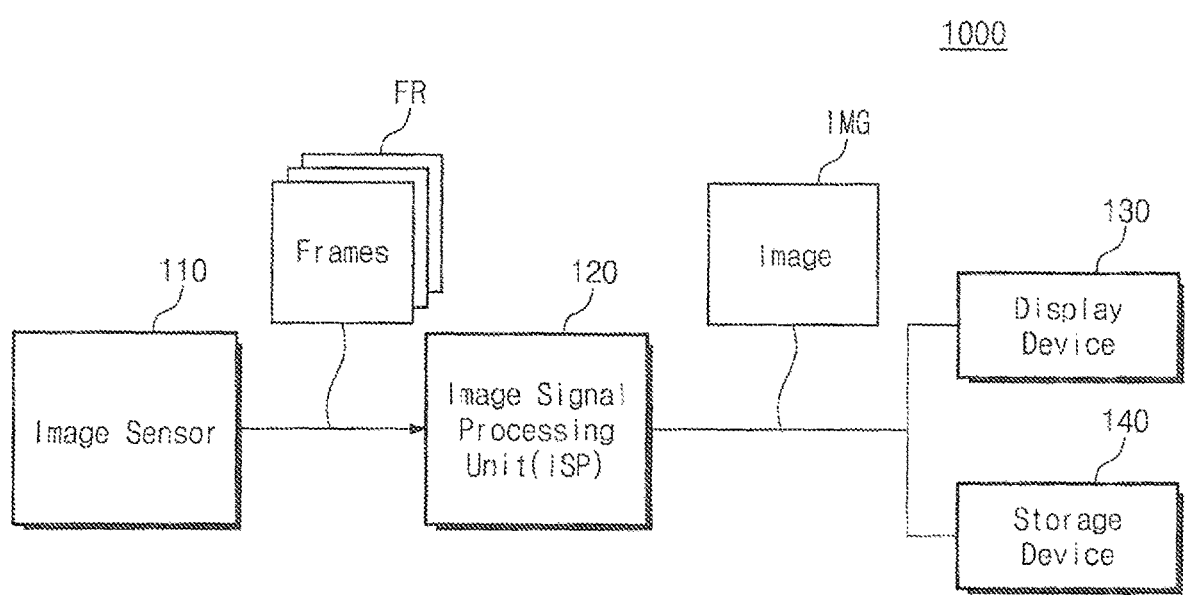
FIG. 1 is a block diagram of an image processing device according to some embodiments of the inventive concept.

The inventive concept will now be described more fully with reference to the accompanying drawings, in which example embodiments of the inventive concept are shown. Like reference numerals may refer to like elements throughout this description. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a block diagram of an image processing device according to some embodiments of the inventive concept.

Referring to FIG. 1, an image processing device 1000 may include an image sensor 110, an image signal processing unit (ISP) 120, a display device 130, and a storage device 140.

The image processing device 1000 may be any of a type of electronic device that is configured to acquire an external image, such as a smart phone or a digital camera.

The image sensor 110 may convert an image of an external object into an electrical signal or a data signal. The image sensor 110 may include a plurality of pixels. Each pixel may receive light reflected from the external object and may convert the received light into an electrical image signal or a photo signal.

The image signal processing unit 120 may signal-process frame data (e.g., image data or photo data) FR received form the image sensor 110 and may output corrected image data IMG. For example, the image signal processing unit 120 may generate the image data IMG by performing a signal processing operation, such as color interpolation, color correction, gamma correction, color space conversion, and/or edge correction, on the received flame data FR.

The display device 130 may output the image data IMG from the image signal processing unit 120 so that a user may check. The display device 130 may include one or more displays, such as a liquid crystal display panel, an organic light emitting display panel, an electrophoretic display panel, and an electrowetting display panel. The display device 130 may output the image data IMG through the display panel.

The storage device 140 may be configured to store the image data IMG output from the image signal processing unit 120. The storage device 140 may include a volatile memory, such as an SRAM, a DRAM, a synchronous DRAM, a nonvolatile memory, such as a ROM, an EPROM, an EEPROM, a flash memory device, a PRAM, an MRAM, an RRAM, and/or a FRAM.

Figure 2:
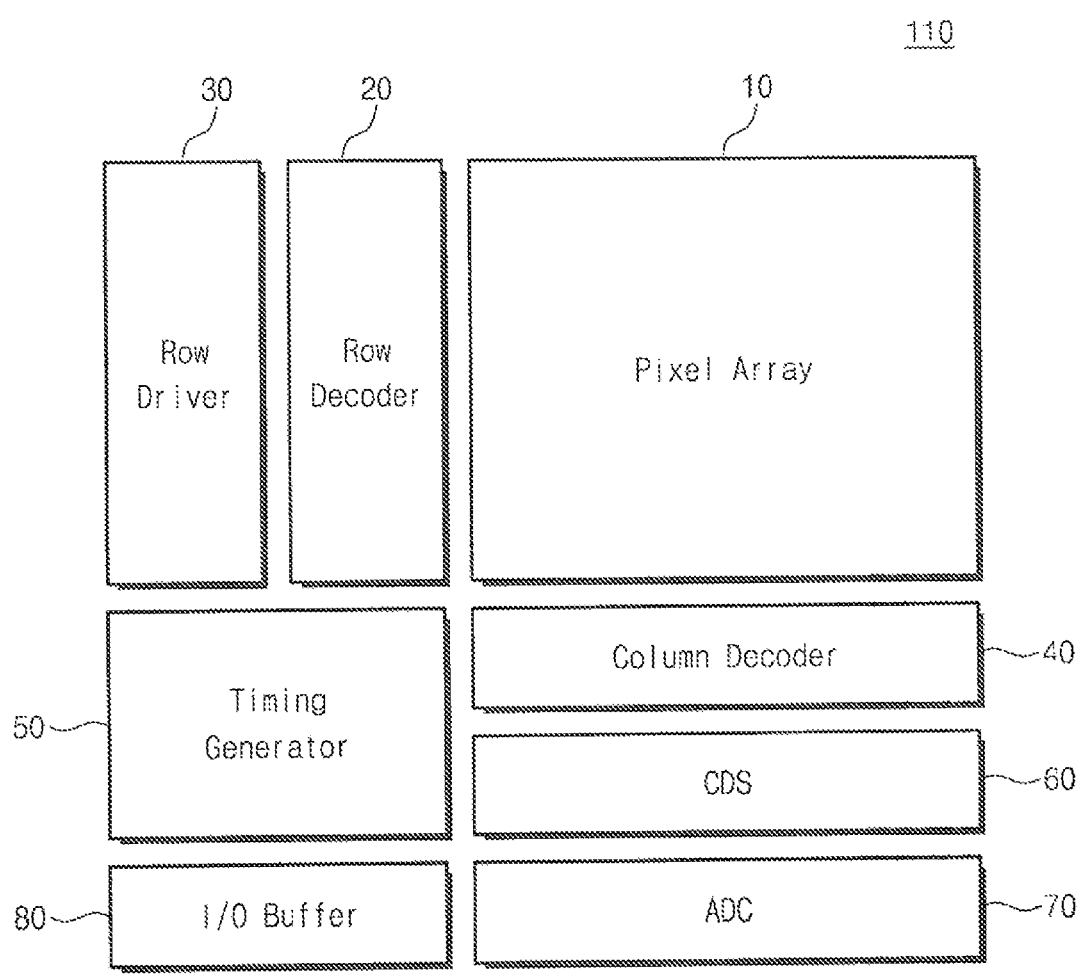
FIG. 2 is a block diagram of an image sensor according to some embodiments of the inventive concept.

FIG. 2 is a block diagram of an image sensor according to some embodiments of the inventive concept.

Referring to FIG. 2, an image sensor 110 may include a pixel array 10, a row decoder 20, a row driver 30, a column decoder 40, a timing generator 50, a correlated double sampler (CDS) 60, an analog to digital converter 70, and an input/output (I/O) buffer 80.

The pixel array 10 may include a plurality of unit pixels arranged in rows and columns and may convert light incident on the unit pixels into an electrical signal. The pixel array 10 may be driven by a plurality of driving signals, such as a selection signal, a reset signal, and a charge transfer signal, provided from the row decoder 20.

The row decoder 20 may provide the driving signals to each row of the unit pixels. The electrical signal converted in the pixel array 10 in response to the driving signals may be provided to the correlated double sampler 60.

The row driver 30 may provide the plurality of driving signals for driving the plurality of unit pixels to the pixel array 10 based on the results decoded in the row decoder 20. When the unit pixels are arranged in rows and columns, the driving signals may be provided to each row of the unit pixels.

The timing generator 50 may control the row and column decoders 20 and 40, the correlated double sampler 60, the analog to digital converter 70, and the input/output buffer 80 and may supply control signals, such as a clock signal or a timing control signal, to drive their operations. The timing generator 50 may include a logic control circuit, a phase lock loop (PLL) circuit, a timing control circuit, and a communication interface circuit.

The correlated double sampler 60 may receive, hold, and sample the electrical signal generated from the pixel array 10. The correlated double sampler 60 may double sample a signal level by sampling a specific noise level and an electrical signal level and may output a difference level corresponding to difference between the noise level and the electrical signal level.

The analog to digital converter 70 may convert an analog signal corresponding to the difference level output from the correlated double sampler 60 into a digital signal and may output the digital signal.

The input/output buffer 80 may latch the digital signal output from the analog to digital converter 70, and the latched signal may sequentially output the digital signal to an image signal processing unit based on the results decoded in the column decoder 40.

Figure 3:
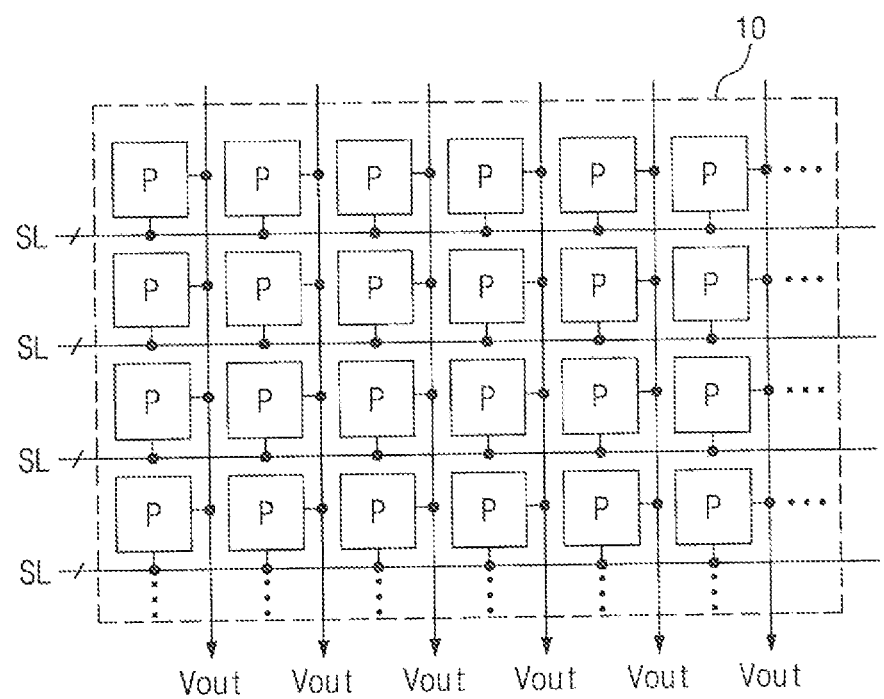
FIG. 3 is a schematic block diagram of a pixel array of an image sensor according to some embodiments of the inventive concept.

FIG. 3 is a schematic block diagram of a pixel array of an image sensor according to some embodiments of the inventive concept.

Referring to FIG. 3, the pixel array 10 may include a plurality of unit pixels P arranged in two-dimensions along a plurality of rows and a plurality of columns, a plurality of driving signal lines SL, and a plurality of output lines Vout.

An electrical signal may be generated in each of the unit pixels P by incident light. The unit pixels P may be driven by a driving signal transmitted through the driving signal lines SL connected to the unit pixels P.

The driving signal lines SL may extend in a row direction (a horizontal direction in the block diagram of FIG. 3) so that the unit pixels P of the same row may be substantially simultaneously driven. In some embodiments, the driving signal lines SL may include a transfer signal line, a reset signal line, a sampling signal line, a calibration signal line, a pre-charge signal line, and a selection signal line. The transfer signal line, the reset signal line, the selection signal line may be commonly connected to the unit pixels P of the same row. The output lines Vout may extend in a column direction (a vertical direction in the block diagram of FIG. 3) and may be commonly connected to the unit pixels P of the same column.

Each of the unit pixels P may include a photoelectric conversion device and a plurality of metal oxide semiconductor (MOS) transistors constituting a readout circuit and a sampling circuit.

The photoelectric conversion device of the unit pixels P may generate photoelectric charges in proportion to an amount of light incident from the outside. The generated photoelectric charges may be converted into a voltage in proportion to an amount thereof and the voltage may be stored. Therefore, in some embodiments, in each of the unit pixels P, the generated photoelectric charges may be converted into voltage in proportion to an amount thereof and the voltage may be stored.

The unit pixels P may include a sampling circuit configured to hold and sample the photoelectric charges generated from the photoelectric conversion device. Thus, the image sensor according to example embodiments may be configured to operate in a global shutter mode. When the image sensor operates, all the unit pixels P are substantially simultaneously exposed, such that the photoelectric charges are substantially simultaneously stored in each of the unit pixels P, and pixel signals may be sequentially output row by row.

In some embodiments, the unit pixels P may have the same circuit configuration, and these embodiments will be described in more detail with reference to FIGS. 4A, 4B, and 4C.

Figure 4A:
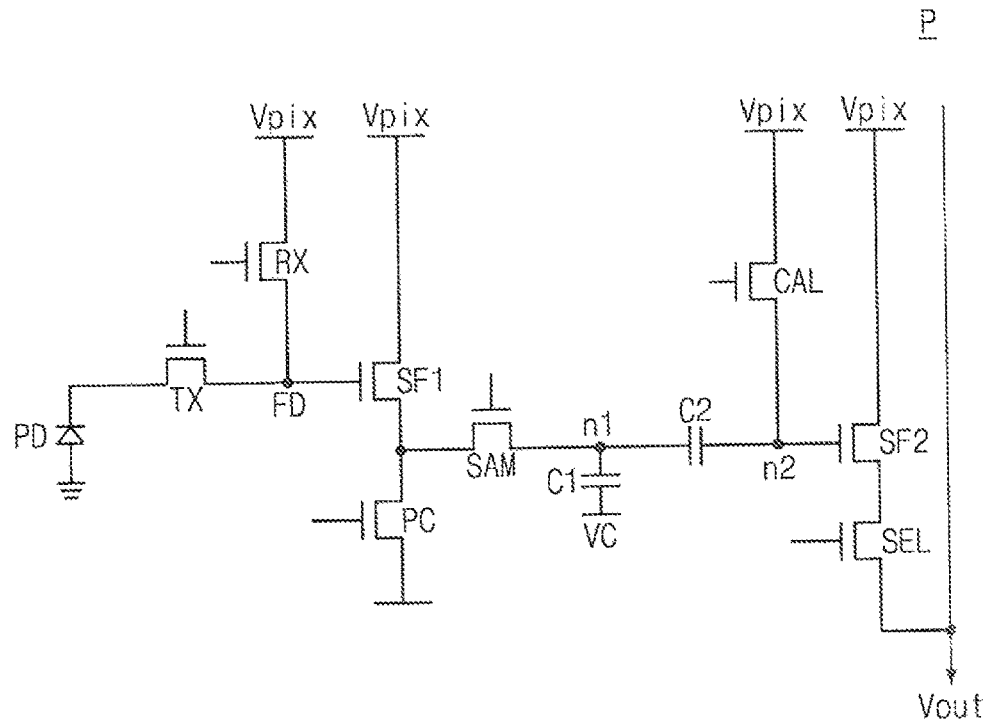
FIGS. 4A, 4B, and 4C are circuit diagrams illustrating a unit pixel of a pixel array according to some embodiments of the inventive concept.
Figure 4B:
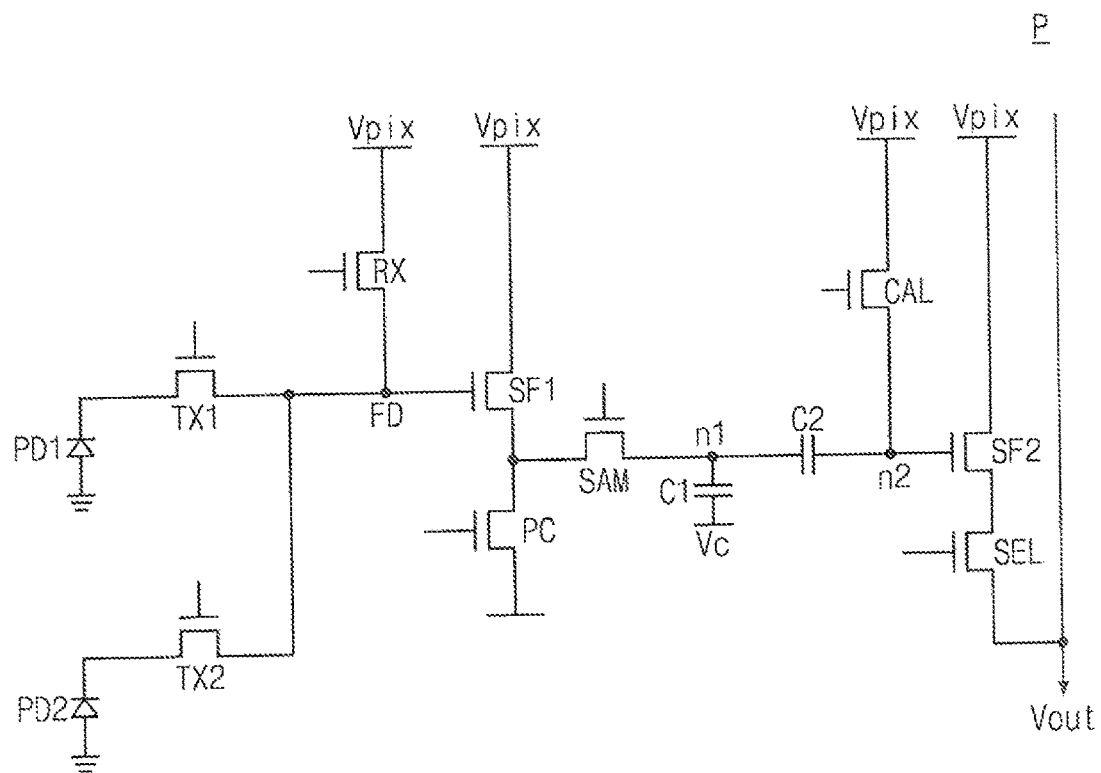
Figure 4C:
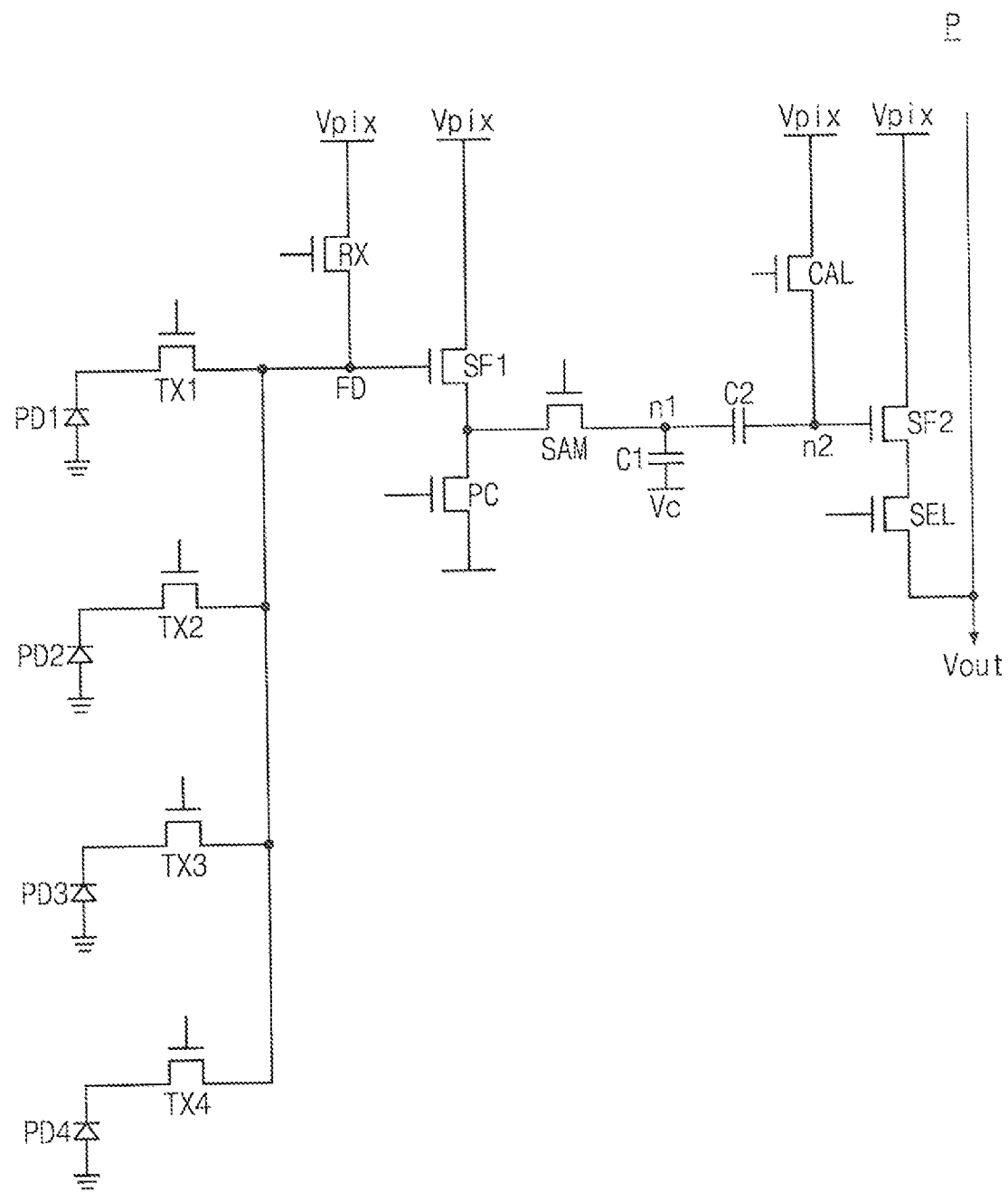

FIGS. 4A, 4B, and 4C are circuit diagrams illustrating a unit pixel of a pixel array according to example embodiments of the inventive concept.

Referring to FIG. 4A, an image sensor according to example embodiments may have an in-pixel correlated double sampling structure.

Each unit pixel P may include a photoelectric conversion device PD, a transfer transistor TX, a reset transistor RX, a first source follower transistor SF1, a pre-charge transistor PC, a sampling transistor SAM, a calibration transistor CAL, a second source follower transistor SF2, a selection transistor SEL, a first capacitor C1, and a second capacitor C2.

The transfer transistor TX may be connected between the photoelectric conversion device PD and a charge detection node (i.e., a floating diffusion region) FD. The transfer transistor TX may transfer the charges accumulated in the photoelectric conversion device PD to the charge detection node FD. The transfer transistor TX may operate responsive to a charge transfer signal input to a transfer gate electrode.

The photoelectric conversion device PD may generate photoelectric charges in proportion to an amount of light incident from the outside and may accumulate the photoelectric charges. The photoelectric conversion device PD may include a photo diode, a photo transistor, a photo gate, a pinned photo diode, or a combination thereof.

The charge detection node FD may receive the charges generated from the photoelectric conversion device PD and may cumulatively store the charges. A potential of a gate electrode of the first source follower transistor SF1 may be varied based on an amount of the photoelectric charges accumulated in the charge detection node FD.

The reset transistor RX may periodically reset the charges accumulated in the charge detection node FD. The reset transistor RX may operate responsive to a reset signal input to a gate electrode thereof. A drain of the reset transistor RX may be connected to the charge detection node FD. A source of the reset transistor RX may be connected to a power source voltage Vpix. When the reset transistor RX is turned on, the power source voltage Vpix connected to the source of the reset transistor RX may be applied to the charge detection node FD. In other words, when the reset transistor RX is turned on, the photoelectric charges accumulated in the charge detection node FD may be discharged, such that the charge detection node may be reset.

The first source follower transistor SF1 may be a source follower buffer amplifier for generating a source-drain current in proportion to an amount of the photoelectric charges input to a gate electrode thereof.

A drain of the first source follower transistor SF1 may be connected to the power source voltage Vpix. A source of the first source follower transistor SF1 may be connected to a source of the calibration transistor CAL and a source of the sampling transistor SAM.

The sampling transistor SAM may be connected between the source of the first source follower transistor SF1 and a first node n1.

First electrodes of the first and second capacitors C1 and C2 may be connected to the first node n1. A capacitor voltage Vc may be applied to a second electrode of the first capacitor C1, and a second electrode of the second capacitor C2 may be connected to a second node n2.

A drain of the calibration transistor CAL may be connected to the power source voltage Vpix. A source of the calibration transistor CAL may be connected to the second node n2. The calibration transistor CAL, may calibrate the second node n2.

A gate electrode of the second source follower transistor SF2 may be connected to the second node n2. A drain of the second source follower transistor SF2 may be connected to the power source voltage Vpix. A source of the second source follower transistor SF2 may be connected to a drain of the selection transistor SEL.

The second source follower transistor SF2 may amplify a potential variation in the second node n2 and may output a pixel signal to the output line Vout through the selection transistor SEL.

An operation of the unit pixel P may include a reset phase of resetting the photoelectric conversion device PD and the charge detection node FD, an optical accumulation phase of accumulating the photoelectric charges in the photoelectric conversion device PD, and a sampling phase of outputting the accumulated photoelectric charges as the pixel signal. The sampling phase may include a reset signal sampling phase and an image signal sampling phase.

In the reset phase, the reset transistor RX and the transfer transistor TX may be turned on. Thus, the pixel power source voltage Vpix may be applied to the charge detection node FD, such that the charges may be discharged from the photoelectric conversion device PD and the charge detection node FD to be reset.

After the photoelectric conversion device PD and the charge detection node FD are reset, the photoelectric charges may be generated and accumulated in the photoelectric conversion device PD over a time interval from turning-off of the transfer transistor TX until turning-on of the transfer transistor TX (e.g., during a photoelectric conversion time).

After the optical accumulation phase, the charge detection node FD may be reset to the pixel power source voltage Vpix. The reset signal may include a noise component. The reset signal including the noise component may be amplified in the first source follower transistor SF1.

In the reset signal sampling phase, the sampling transistor SAM may be turned on, and the first capacitor C1 and the second capacitor C2 may sample the reset signal.

In the beginning of the reset signal sampling phase, the first capacitor C1 and the second capacitor C2 may erase their previous sampled voltage and may be pre-charged, such that the first source follower transistor SF1 may sample a new voltage. Such a pre-charge operation may be conducted using the pre-charge transistor PC. In the reset signal sampling phase, the calibration transistor CAL may be turned off.

After the reset signal sampling phase, the transfer transistor TX may be turned on again, and the image signal detected in the charge detection node FD may not include noise.

In the image signal sampling phase, the sampling transistor SAM may be turned on, and the first capacitor C1 and the second capacitor C2 may sample the image signal. Here, a voltage of the first capacitor C1 may be a voltage value in proportion to an amount of charge transferred by the transfer transistor TX. Accordingly, the value of the voltage across the first capacitor C1 may be a new voltage value different from the previous reset signal.

In the image signal sampling phase, the second node n2 of the second capacitor C2 may float, and a charge amount of the second capacitor C2 may be maintained to the charge amount in the previous reset signal sampling phase. The second node n2 of the second capacitor C2 may drop from the calibrated voltage (e.g., Vpix) with the same range as a voltage drop on the first node n1 of the second capacitor C2.

Because the second node n2 of the second capacitor C2 may be calibrated to the calibrated voltage (e.g., Vpix) in the reset signal sampling phase, the noise component may not be included. Thus, the pixel signal Vout may be transmitted to the analog-digital convertor without the noise component.

In the image signal sampling phase, the second capacitor C2 may charge to a voltage corresponding to a difference between the image signal generated from the pixel P and the voltage (e.g., reset signal Vres) charged in the reset signal sampling phase.

In each pixel P, an image signal level by a specific noise level and an image may be double-sampled, and, thus, the pixel signal Vout corresponding to a difference between the noise level and the image signal level may be output from each pixel P. In other words, in each pixel P, the voltage in proportion to a difference between a potential of the charge detection node FD in the reset state and a potential of the charge detection node FD based on the photoelectric charge generated by the image signal may be generated.

According to the example embodiments of FIG. 4B, the unit pixel P may include first and second photoelectric conversion devices PD1 and PD2 and first and second charge transfer transistors TX1 and TX2. The first and second transfer transistors TX1 and TX2 may share the charge detection node FD. The first and second transfer transistors TX1 and TX2 may operate responsive to the charge transfer signals.

According to the example embodiments of FIG. 4C, the unit pixel P may include first, second, third, and fourth photoelectric conversion devices PD1, PD2, PD3, and PD4 and first, second, third, and fourth charge transfer transistors TX1, TX2, TX3, and TX4. The first to fourth charge transfer transistors TX1, TX2, TX3, and TX4 may share the charge detection node FD. The first, second, third, and fourth charge transfer transistors TX1, TX2, TX3, and TX4 may separately operate responsive to the charge transfer signals.

Figure 5:
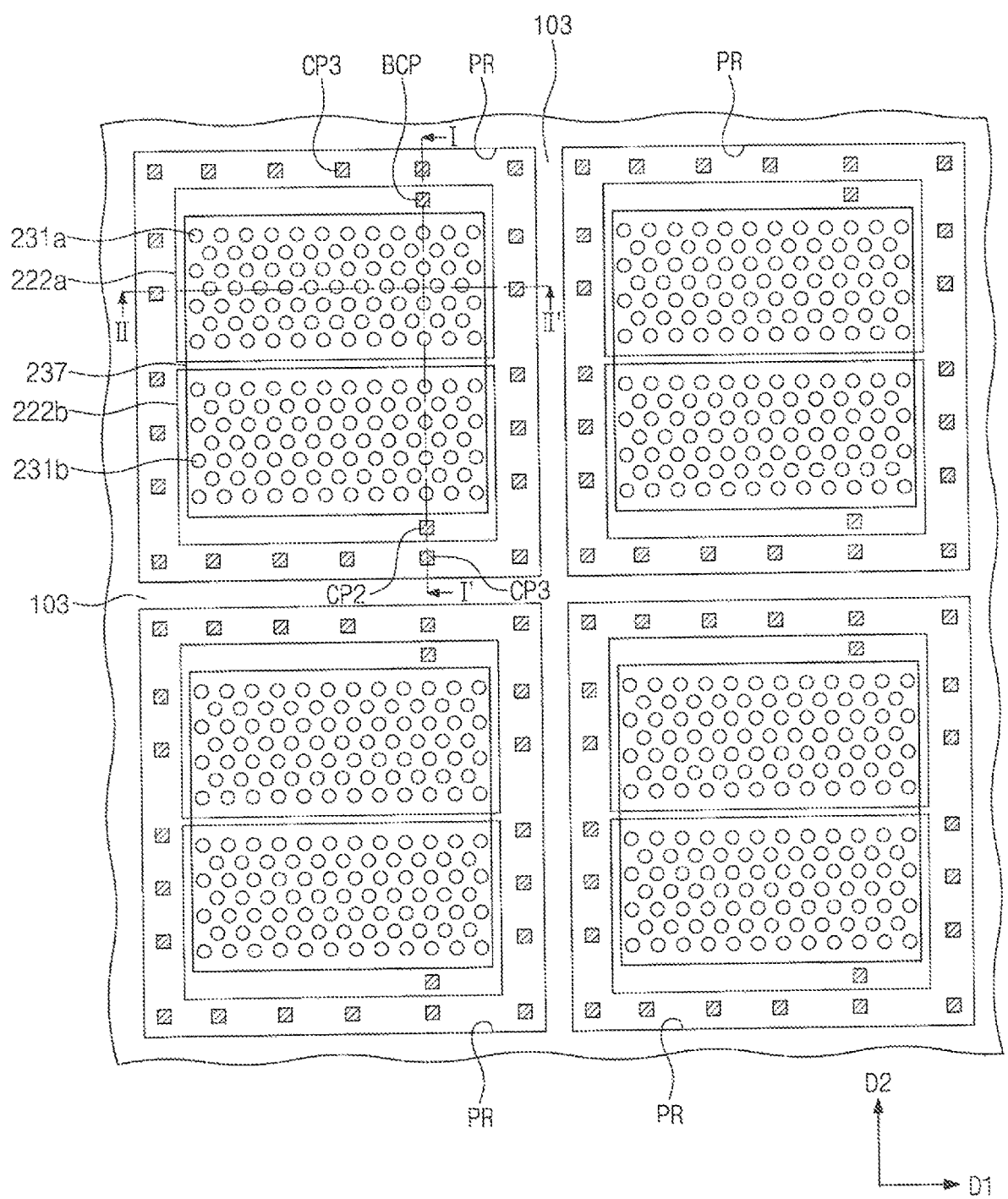
FIG. 5 is a plan view of an image sensor according to some embodiments of the inventive concept.
Figure 6A:
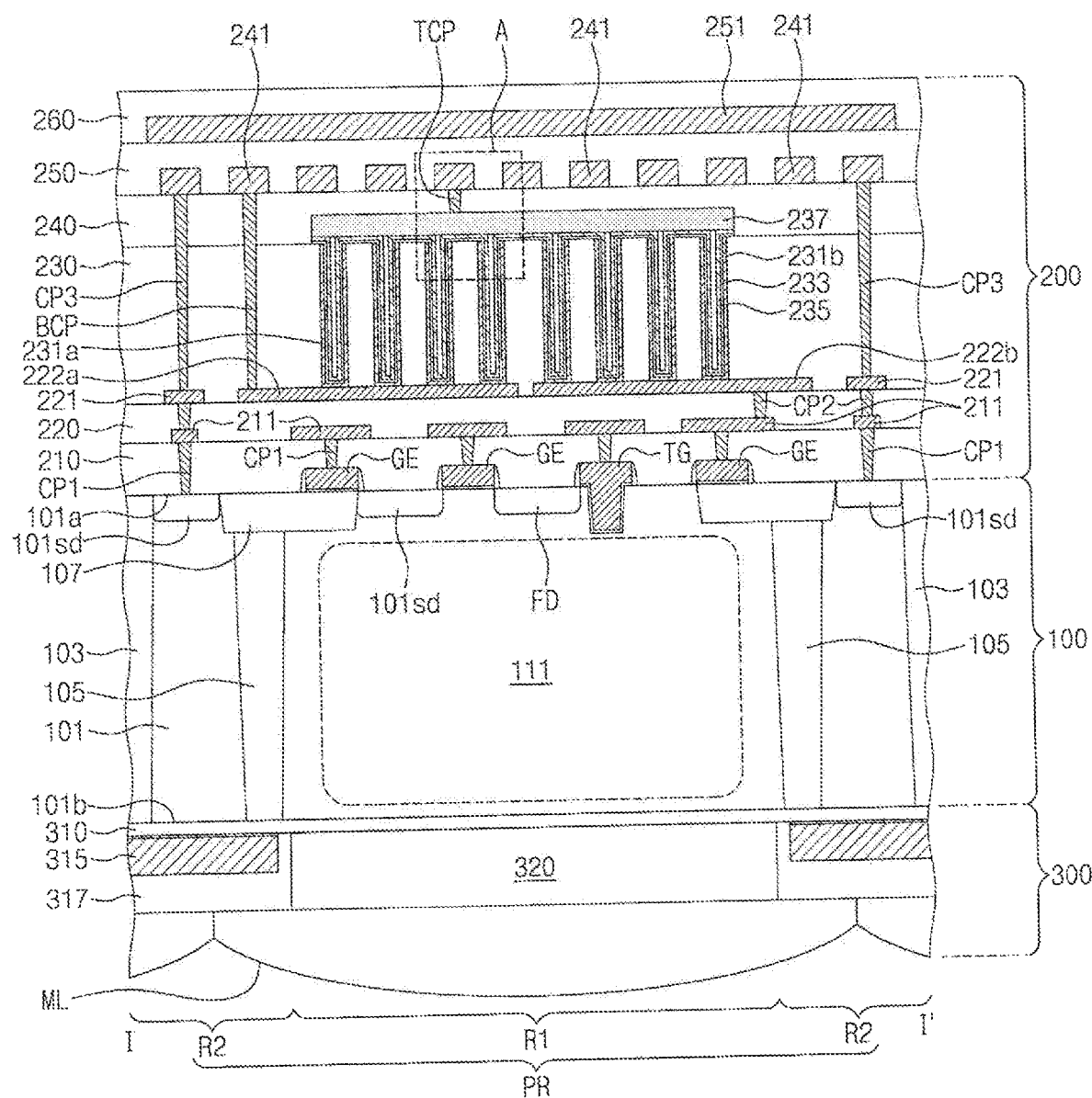
FIGS. 6A and 6B are cross-sectional views taken along lines I-I' and II-II', respectively, of FIG. 5, illustrating an image sensor according to some embodiments of the inventive concept.
Figure 6B:
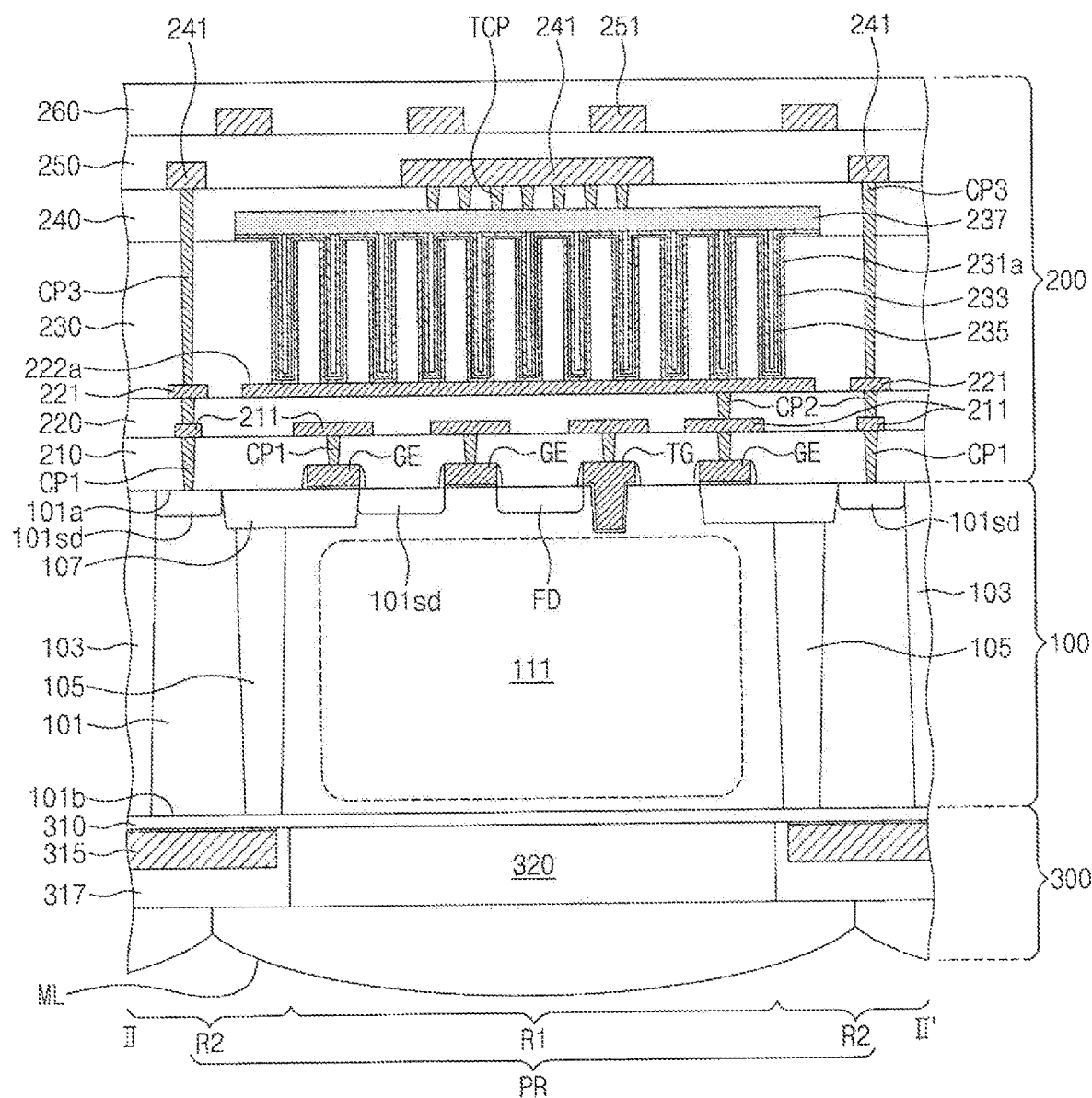
Figure 7:
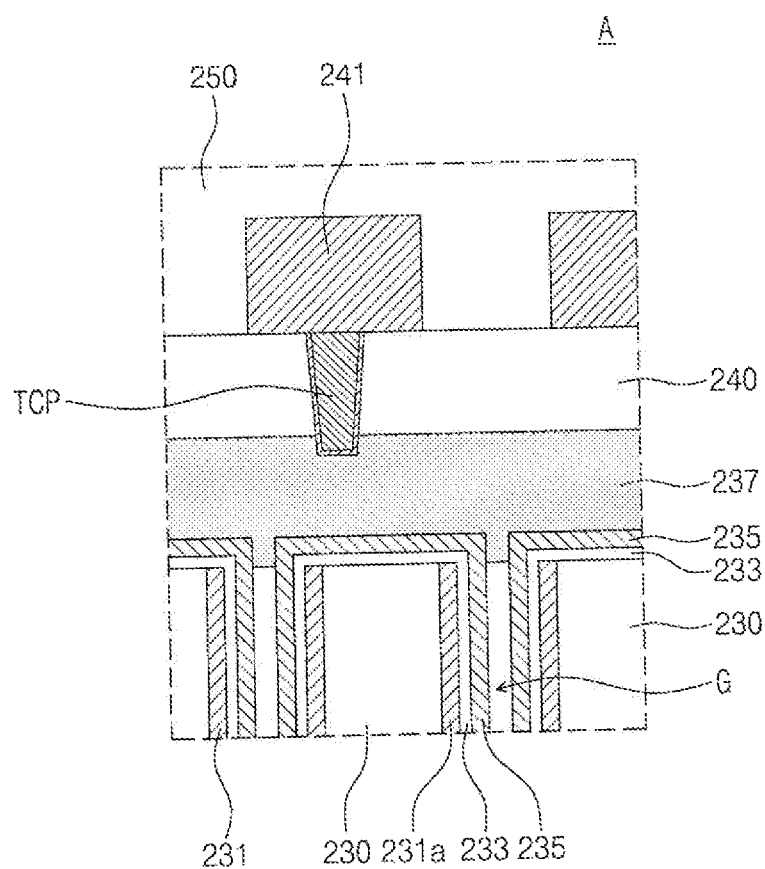
FIG. 7 is an enlarged view of portion A of FIG. 6A.

FIG. 5 is a plan view of an image sensor according to some embodiments of the inventive concept. FIGS. 6A and 6B are cross-sectional views taken along line I-I' and II-II', respectively, of FIG. 5, illustrating an image sensor according to some embodiments of the inventive concept. FIG. 7 is an enlarged view of portion A of FIG. 6A.

Referring to FIGS. 5, 6A, and 6B, an image sensor according to example embodiments may include a photoelectric conversion layer 100, an integrated circuit layer 200, and a light transmitting layer 300. The photoelectric conversion layer 100 may be disposed between the integrated circuit layer 200 and the light transmitting layer 300 in a vertical direction as shown in FIGS. 6A and 6B.

The photoelectric conversion layer 100 may include a semiconductor substrate 101, a pixel separation structure 103 defining pixel regions PR, and photoelectric conversion regions 111 in the semiconductor substrate 101.

The semiconductor substrate 101 may have a first surface (or front surface) 101a and a second surface (or back surface) 101b that are opposite to each other. The semiconductor substrate 101 may be a substrate in which an epitaxial layer of first conductivity type is formed on a bulk silicon substrate of a first conductivity type (e.g., p-type). In some embodiments, the semiconductor substrate 101 may be a substrate in which a bulk silicon substrate may be removed during the manufacturing of the image sensor and a p-type epitaxial layer may remain. In some embodiments, the semiconductor substrate 101 may be a bulk semiconductor substrate including a well of a first conductivity type.

The pixel separation structure 103 may be disposed in the semiconductor substrate 101 and may define a plurality of pixel regions PR arranged in a matrix form along a first direction D1 and a second direction D2. The pixel separation structure 103 may at least partially surround each of the pixel regions PR, in a plan view. The pixel separation structure 103 may include first portions extending parallel along the first direction D1 and second portions crossing the first portions and extending parallel along the second direction D2.

The pixel separation structure 103 may be formed of an insulating material having a lower refractive index than the semiconductor substrate (e.g., silicon substrate) 101 and may include one or more insulating layers. The pixel separation structure 103 may include, for example, a silicon oxide layer, a silicon nitride layer, an undoped polysilicon layer, air, or a combination thereof. In some embodiments, the pixel separation structure 103 may be an impurity region formed by doping a first conductivity type impurity into the first conductivity type semiconductor substrate 101.

The pixel separation structure 103 may penetrate (or extend through) the semiconductor substrate 101. A vertical thickness of the pixel separation structure 103 may be substantially the same as a vertical thickness of the semiconductor substrate 101. In some embodiments, a vertical thickness of the pixel separation structure 103 may be less than a vertical thickness of the semiconductor substrate 101 in a cross-sectional view.

The isolation structure 105 may penetrate the semiconductor substrate 101 in each pixel region PR and may define a light receiving region R1 and a light blocking region R2. Each pixel region PR may include the light receiving region R1 and the light blocking region R2. The isolation structure 105 may extend in the first direction D1 or the second direction D2.

The isolation structure 105 may have substantially the same structure as the pixel separation structure 103. The isolation structure 105 may be formed of an insulating material having a lower refractive index than the semiconductor substrate (e.g., silicon substrate) 101 and may include one or more insulating layers.

The photoelectric conversion region 111 may be provided in the light receiving region R1 of each pixel region PR. The photoelectric conversion region 111 may be formed by implanting an impurity having a second conductivity type opposite of the first conductivity type of the semiconductor substrate 101 in the semiconductor substrate 101.

Photodiodes may be formed at the junction of the semiconductor substrate 101 of the first conductivity type and the photoelectric conversion regions 111 of the second conductivity type. The light incident from the outside may be converted into an electrical signal in the photoelectric conversion regions 111.

A device isolation layer 107 may be disposed adjacent the first surface 101a of the semiconductor substrate 101 and may define active regions.

The integrated circuit layer 200 may be disposed on the first surface 101a of the semiconductor substrate 101. The integrated circuit layer 200 may include readout circuits and sampling circuits electrically connected to the photoelectric conversion regions 11. The integrated circuit layer 200 may include the reset transistor RX, the first and second source follower transistors SF1 and SF2, the sampling transistor SAM, the pre-charge transistor PC, the calibration transistor CAL, the selection transistor SEL, and the first and second transistors C1 and C2 as described with reference to FIG. 3.

As an example, the transfer transistor TX, the reset transistor RX, and the first follower transistor SF1 may be disposed in the light receiving region R1, and the sampling transistor SAM, the pre-charge transistor PC, the calibration transistor CAL, the selection transistor SEL, and the second source follower transistor SF2 may be disposed in the light blocking region R2.

In each pixel region PR, a transfer gate electrode TG and gate electrodes GE of the MOS transistors described with reference to FIG. 3 may be disposed on the first surface 101a of the semiconductor substrate 101.

A portion of the transfer gate TG may be disposed in the semiconductor substrate 101, and a gate insulation layer may be interposed between the transfer gate electrode TG and the semiconductor substrate 101.

The gate electrodes TG and GE of the transistors may include one or more materials, such as impurity-doped polysilicon, a metal silicide, such as cobalt silicide, a metal nitride, such as titanium nitride, and a metal, such as tungsten, copper, or aluminum. The gate insulation layer may include one or more materials, such as silicon oxide, silicon nitride, an insulating metal oxide, and/or an insulating metal nitride.

The floating diffusion region FD may be provided to the semiconductor substrate 101 at a side of the transfer gate electrode TG. Source/drain impurity regions 101sd of the MOS transistors as described with reference to FIG. 3 may be provided in the semiconductor substrate 101.

The floating diffusion region FD and the source/drain impurity regions 101sd may be formed by implanting an impurity having a conductivity type opposite of the conductivity type of the semiconductor substrate 101. For example, the floating diffusion region FD and the source/drain impurity regions 101sd may be n-type impurity regions.

A first interlayer insulation layer 210 may at least partially cover the first surface 101a of the semiconductor substrate 101 and may at least partially cover the MOS transistors. First wiring lines 211 may be disposed on the first interlayer insulation layer 210. The first wiring lines 211 may be electrically connected to the MOS transistors through first contact plugs CP1.

A second interlayer insulation layer 220 may be disposed on the first interlayer insulation layer 210 and may at least partially cover the first wiring lines 211. The first and second interlayer insulation layers 210 and 220 may include, for example, silicon oxide, silicon nitride, and/or silicon oxynitride.

First and second lower pad electrodes 222a and 222b and second wiring lines 221 may be disposed on the second interlayer insulation layer 220. The first and second lower pad electrodes 222a and 222b may be spaced apart from each other in each pixel region PR. The first and second lower pad electrodes 222a and 222b may each have a plate shape. The first and second lower pad electrodes 222a and 222b may overlap the photoelectric conversion region 111, in a plan view.

The second wiring lines 221 may be selectively connected to some of the first wiring lines 211 through the second contact plugs CP2. The second lower pad electrode 222b may be connected to the first wiring lines 211 through any of the second contact plugs CP2. The second lower pad electrode 222b may be electrically connected to the gate electrode of the second source follower transistor and the source/drain impurity region 101sd of the calibration transistor through the first and second contact plugs CP1 and CP2 and the first wiring lines 211.

The second wiring lines 221 and the first and second lower pad electrodes 222a and 222b may include a first metal material, for example, a metal, such as tungsten or titanium, and/or a conductive metal nitride, such as titanium nitride, tantalum nitride, or tungsten nitride.

The plate shaped first and second lower pad electrodes 222a and 222b may reflect the light incident through the semiconductor substrate 101, such that the reflected light may be incident again on the photoelectric conversion region 111.

A mold insulation layer 230 may be disposed on the second interlayer insulation layer 220 to at least partially cover the second wiring lines 221 and the first and second lower pad electrodes 222a and 222b.

The mold insulation layer 230 may have a plurality of openings exposing the first and second lower pad electrodes 222a and 222b. The mold insulation layer 230 may include silicon oxide, silicon nitride, and/or silicon oxynitride.

Lower electrodes 231a and 231b may be disposed in the openings, respectively. In some embodiments, the lower electrodes 231a and 231b include a plurality of first lower electrodes 231a on the first lower pad electrode 222a and a plurality of second lower electrodes 231b on the second lower pad electrode 222b.

The first lower electrodes 231a may be arranged on the first lower pad electrode 222a along both the first direction D1 and the second direction D2. Adjacent first lower electrodes 231a and adjacent second lower electrodes 231b may be arranged to be offset with respect to each other. The first lower electrodes 231a may be arranged in a zigzag pattern or a honeycomb shape on the first lower pad electrode 222a. The second lower electrodes 231b may be arranged in a zigzag pattern or a honeycomb shape on the second lower pad electrode 222b. For example, the centers of adjacent at least three first lower electrodes 231a arranged in the first direction D1 or the second direction D2 may be arranged at the same intervals, and the centers of adjacent at least three second lower electrodes 231b arranged in the first direction D1 or the second direction D2 may be arranged at the same intervals.

Because the first and second lower electrodes 231a and 231b are arranged in the zigzag pattern or the honeycomb shape, it is possible that a diameter of each of the first and second lower electrodes 231a and 231b is increased, and integration densities of the first and second lower electrodes 231a and 231b may be increased. In some embodiments, the first and second lower electrodes 231a and 231b may be arranged in a matrix form at predetermined intervals along the first direction and second direction.

As an example, each of the first and second lower electrodes 231a and 231b may at least partially cover an inner surface of each of openings and may have a cup shape. Each of the first and second lower electrodes 231a and 231b may have a cylinder shape having a bottom portion and a sidewall portion vertically extending from the bottom portion to define an empty space. Upper surfaces of the first and second lower electrodes 231a and 231b may be substantially coplanar with an upper surface of the mold insulation layer 230.

A dielectric pattern 233 and an upper electrode 235 may be sequentially disposed on the mold insulation layer 230 to conformally at least partially cover the first and second lower electrodes 231a and 231b. The dielectric pattern 233 may be formed with a substantially uniform thickness to at least partially cover the inner surfaces of the first and second lower electrodes 231a and 231b. The upper electrode 235 may be on the dielectric pattern 233 to at least partially cover the first and second lower electrodes 231a and 231b.

The upper electrode 235 may at least partially cover a surface of the dielectric pattern 233 with a substantially uniform thickness. As an example, referring to FIG. 7, the upper electrode 235 may define a gap region G in the openings of the mold insulation layer 230.

The first and second lower electrodes 231a and 231b and the upper electrode 235 may include a refractory metal (e.g., cobalt, titanium, nickel, tungsten, or molybdenum), and/or a metal nitride (e.g., titanium nitride, titanium silicon nitride, titanium aluminum nitride, tantalum nitride, tantalum silicon nitride, tantalum aluminum nitride, or tungsten nitride).

The dielectric pattern 233 may include, for example, a metal oxide, such as HfO2, ZrO2, Al2O3, La2O3, Ta2O3, or TiO2, a dielectric material having a perovskite structure, such as $SrTiO_3(STO)$, $(Ba,Sr)TiO_3(BST)$, $BaTiO_3$, PZT, or PLZT, or a combination thereof. The dielectric pattern 233 may be monolithic or may include one or more layers.

An upper pad electrode 237 may be disposed on the upper electrode 235. The upper pad electrode 237 may include an impurity-doped semiconductor material or a conductive material different from a material of the upper electrode 235. For example, the upper pad electrode 237 may include polysilicon and/or silicon germanium that is doped with an impurity, and/or a metal, such as tungsten, copper, aluminum, titanium, and/or tantalum.

The upper pad electrode 237 may overlap one or both of the first and second lower pad electrodes 222a and 222b in plan view. A thickness of the upper pad electrode 237 may be greater than a thickness of each of the first and second lower pad electrodes 222a and 222b. The upper pad electrode 237 may directly contact portions of the upper electrode 235 on the mold insulation layer 230 and may be spaced apart from (or not contact) other portions of the upper electrode 235 on the inner surfaces of the openings of the mold insulation layer 230, as shown in FIG. 7.

In some embodiments, the upper pad electrode 237, the first lower pad electrode 222a, and the first lower electrodes 231a, the dielectric pattern 233, and the upper electrode 235 that are therebetween may constitute the first capacitor (see C1 of FIG. 3). The upper pad electrode 237, the second lower pad electrode 222b, and the second lower electrodes 231b, the dielectric pattern 233, and the upper electrode 235 that are therebetween may constitute the second capacitor (see C2 of FIG. 3). The upper pad electrode 237 may be commonly connected to the first and second capacitors (see C1 and C2 of FIG. 3).

According to example embodiments, because the first and second lower electrodes 231a and 231b have a relatively high aspect ratio and a cylinder shape, surface areas of the first and second lower electrodes 231a and 231b may increase. In addition, because the first and second lower electrodes 231a and 231b are arranged in a zigzag pattern, the number of the first and second lower electrodes 231a and 231b arranged on the first and second lower pad electrodes 222a and 222b may increase. Thus, the capacitance of the first and second capacitors (see C1 and C2 of FIG. 3) may increase. Accordingly, during the global shutter operation, the loss of the charges and the noise generation may be reduced or prevented, such that the shutter efficiency may be improved.

A third interlayer insulation layer 240 may be disposed on the mold insulation layer 230 to at least partially cover the upper pad electrode 237. A plurality of upper contact plugs TCP may penetrate the third interlayer insulation layer 240 so as to be connected to the upper pad electrode 237. A lower contact plug BCP may penetrate the third interlayer insulation layer 240 and the mold insulation layer 230 so as to be connected to the first lower pad electrode 222a. Third contact plugs CP3 may penetrate the third interlayer insulation layer 240 and the mold insulation layer 230 so as to be connected to at least one of the second wiring lines 221.

The upper contact plugs TCP, the lower contact plug BCP, and the third contact plugs CP3 may include the same metal and may include a barrier metal layer and a metal layer as shown in FIG. 7. The upper contact plugs TCP, the lower contact plug BCP, and the third contact plugs CP3 may include the same first metal material as the first and second wiring lines 211 and 221. The first metal material may include, for example, a metal, such as tungsten, titanium, and/or tantalum, and/or a conductive metal nitride, such as titanium nitride, tantalum nitride, and/or tungsten nitride.

The third wiring lines 241 may be disposed on the third interlayer insulation layer 240 and may be connected to at least one of the second wiring lines 221 through the third contact plugs CP3. One of the third wiring lines 241 may be connected to the upper pad electrode 237 through the plurality of upper contact plugs TCP. At least one of the third wiring lines 241 may have a linear type extending in a direction generally parallel with the first surface 101a of the semiconductor substrate 101 and may be connected to the lower contact plug BCP.

A fourth interlayer insulation layer 250 may be disposed on the third interlayer insulation layer 240 to at least partially cover the third wiring lines 241. Fourth wiring lines 251 may be disposed on the fourth interlayer insulation layer 250. At least one of the fourth wiring lines 251 may have a linear shape crossing the third wiring lines 241.

In some embodiments, the third and fourth wiring lines 241 and 251 over an upper surface of the third interlayer insulation layer 240 may include a second metal material different from the first and second wiring lines 211 and 221 below the upper surface of the third interlayer insulation layer 240. The second metal material may have a resistivity smaller than the first metal material. The second metal material may include, for example, copper or copper alloy. The copper alloy may comprise a small amount of C, Ag, Co, Ta, In, Sn, Zn, Mn, Ti, Mg, Cr, Ge, Sr, Pt, Mg, Al and/or Zr mixed in copper. The third and fourth wiring lines 241 and 251 may each include a barrier metal layer and a metal layer.

Some of the third wiring lines 241 may cross the plurality of pixel regions PR and may include power supplying lines to which the power source voltage and the capacitor voltage are applied. Because the third wiring lines 241 are formed of the second metal material having the smaller resistivity, a signal delay may be reduced.

A fifth interlayer insulation layer 260 may be disposed on the fourth interlayer insulation layer 250 to at least partially cover the fourth wiring lines 251.

The light transmitting layer 300 may be disposed on the second surface 101b of the semiconductor substrate 101. The light transmitting layer 300 may include a planarized insulation layer 310, a light blocking pattern 315, a light filter layer 320, and microlenses ML.

The planarized insulation layer 310 may at least partially cover the second surface 101b of the semiconductor substrate 101. The planarized insulation layer 310 may be formed of an insulating material having a reflection index different from that of the semiconductor substrate 101. For example, the planarized insulation layer 310 may be formed of an insulating material having a reflection index less than that of silicon. The planarized insulation layer 310 may have a reflection index of about 1.4 to 4.0.

The light blocking pattern 315 may be disposed on the planarized insulation layer 310 in the light blocking region R2. The light blocking pattern 315 may reflect or block light incident on the second surface 101b of the semiconductor substrate 101. For light incident on the light blocking region R2 of each pixel PR, the light blocking pattern 315 may prevent the photoelectric charges from being generated in the semiconductor substrate 101 and may block light from being incident on the sampling circuits formed on the first surface 101a of the semiconductor substrate 101. For example, the light blocking pattern 315 may be formed of a metal, such as tungsten or aluminum. A buffer insulation layer 317 may be disposed on the planarized insulation layer 310 to at least partially cover the light blocking pattern 315.

The light filter layer 320 may be disposed on the second surface 101b of the semiconductor substrate 101 in the light receiving region R1. The light filter layer 320 may transmit light of a specific wavelength band from the light incident from the outside. The light filter layer 320 may include color filters and/or an infrared filter.

The microlenses ML corresponding to the photoelectric conversion regions 111, respectively, may be disposed on the light filter layer 320. The microlenses ML may be two-dimensionally arranged along the first direction D1 and the second direction D2 crossing each other. The microlenses ML may have a convex shape and a predetermined radius of curvature. The microlenses ML may change a path of light incident on the image sensor, thus concentrating the light. The microlenses ML may be formed of a light transmitting resin.

Figure 8A:
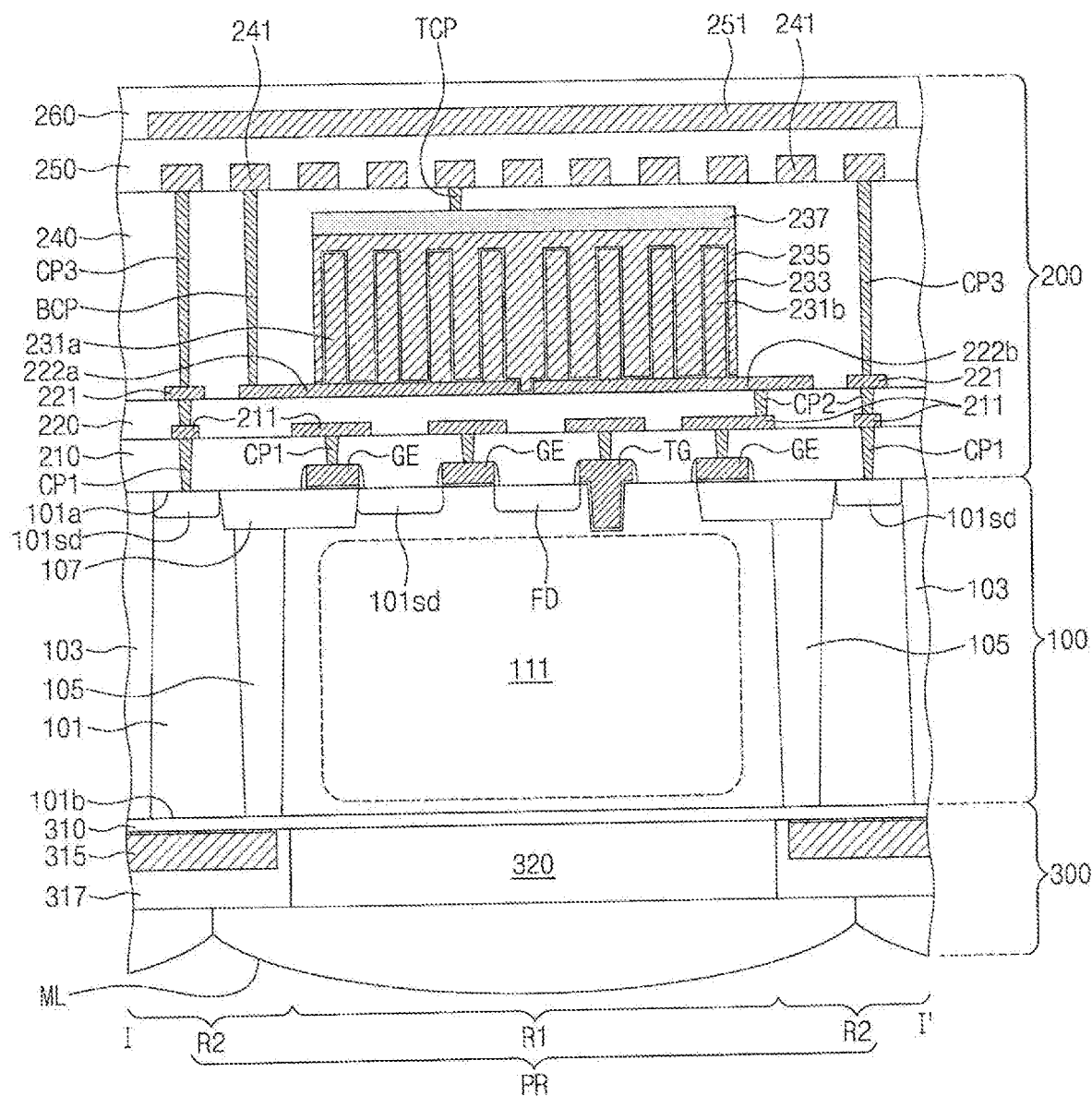
FIGS. 8A and 8B are cross-sectional views taken along lines I-I' and II-II', respectively, of FIG. 5, illustrating an image sensor according to some embodiments of the inventive concept.
Figure 8B:
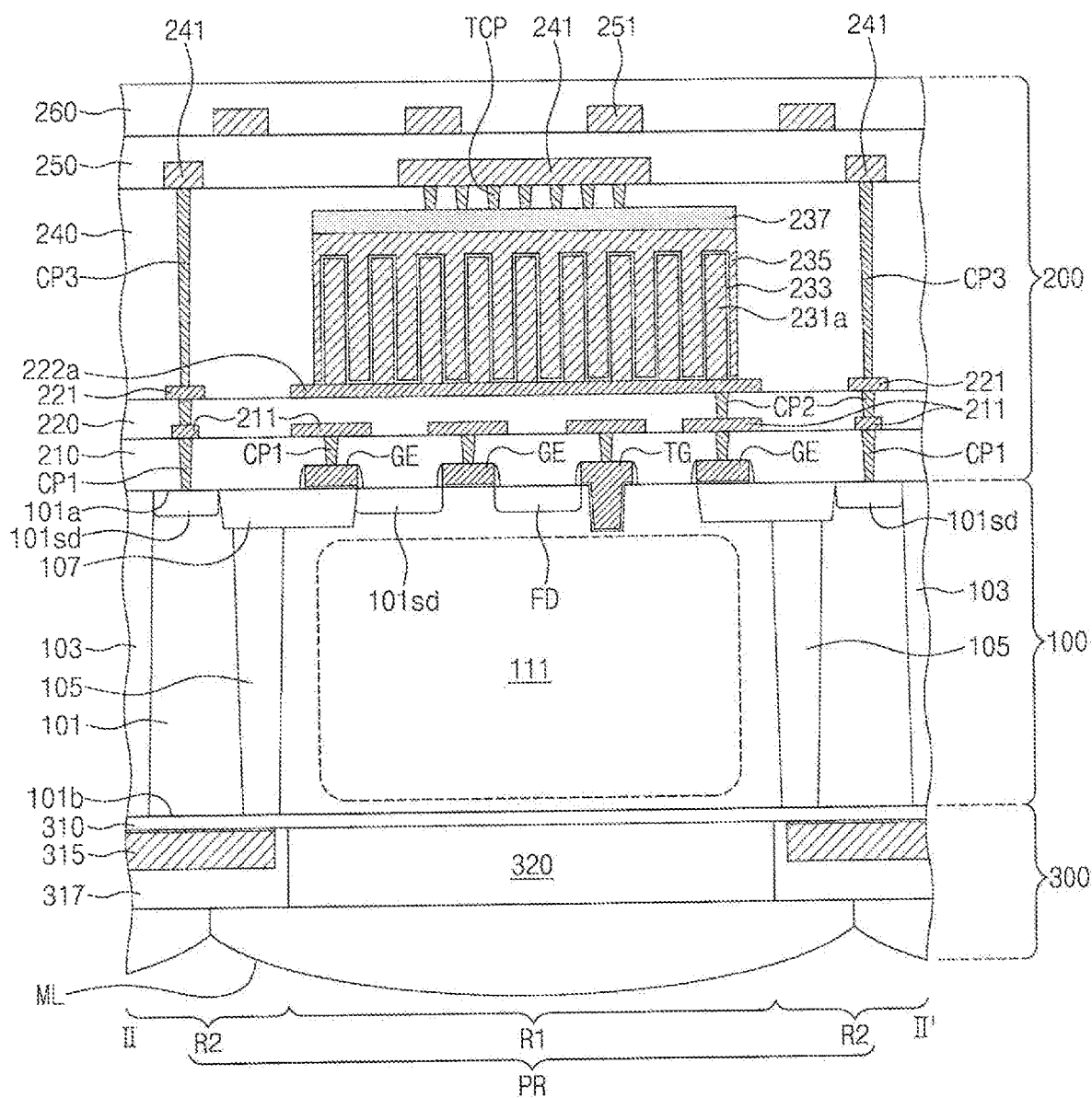

FIGS. 8A and 8B are cross-sectional views taken along line I-I' and II-II', respectively, of FIG. 5, illustrating an image sensor according to some embodiments of the inventive concept. Descriptions of the same elements as those of the above described embodiments will be briefly made or omitted.

Referring to FIGS. 8A and 8B, the first and second lower electrodes 231a and 231b may have a pillar shape. Upper surfaces of the first and second lower electrodes 231a and 231b may be substantially coplanar with each other. The first and second lower electrodes 231a and 231b may have a substantially uniform upper width.

Because the capacitance of capacitor is proportional to a surface area of the first and second lower electrodes 231a and 231b, a height of the first and second lower electrodes 231a and 231b may be increased to increase the surface area of the first and second lower electrodes 231a and 231b formed in a limited area. For example, an aspect ratio (ratio of height to width) of the first and second lower electrodes 231a and 231b may be increased.

The pillar shaped first and second lower electrodes 231a and 231b may be arranged in a zigzag pattern or a honeycomb shape as described above.

The above described mold insulation layer 230 may be omitted in some embodiments, and the dielectric pattern 233 may at least partially cover outer sidewalls of the first and second lower electrodes 231a and 231b with a substantially uniform thickness. The dielectric pattern 233 may at least partially cover the first and second lower pad electrodes 222a and 222b between respective ones of the first and second lower electrodes 231a and 231b.

The upper electrode 235 may at least partially cover a plurality of first lower electrodes 231a and a plurality of second lower electrodes 231b on the dielectric pattern 233 and may at least partially fill spaces between the respective ones of the first and second lower electrodes 231a and 231b. The upper pad electrode 237 may be formed of a conductive material different from that of the upper electrode 235 and may be disposed on the upper electrode 235.

Figure 9:
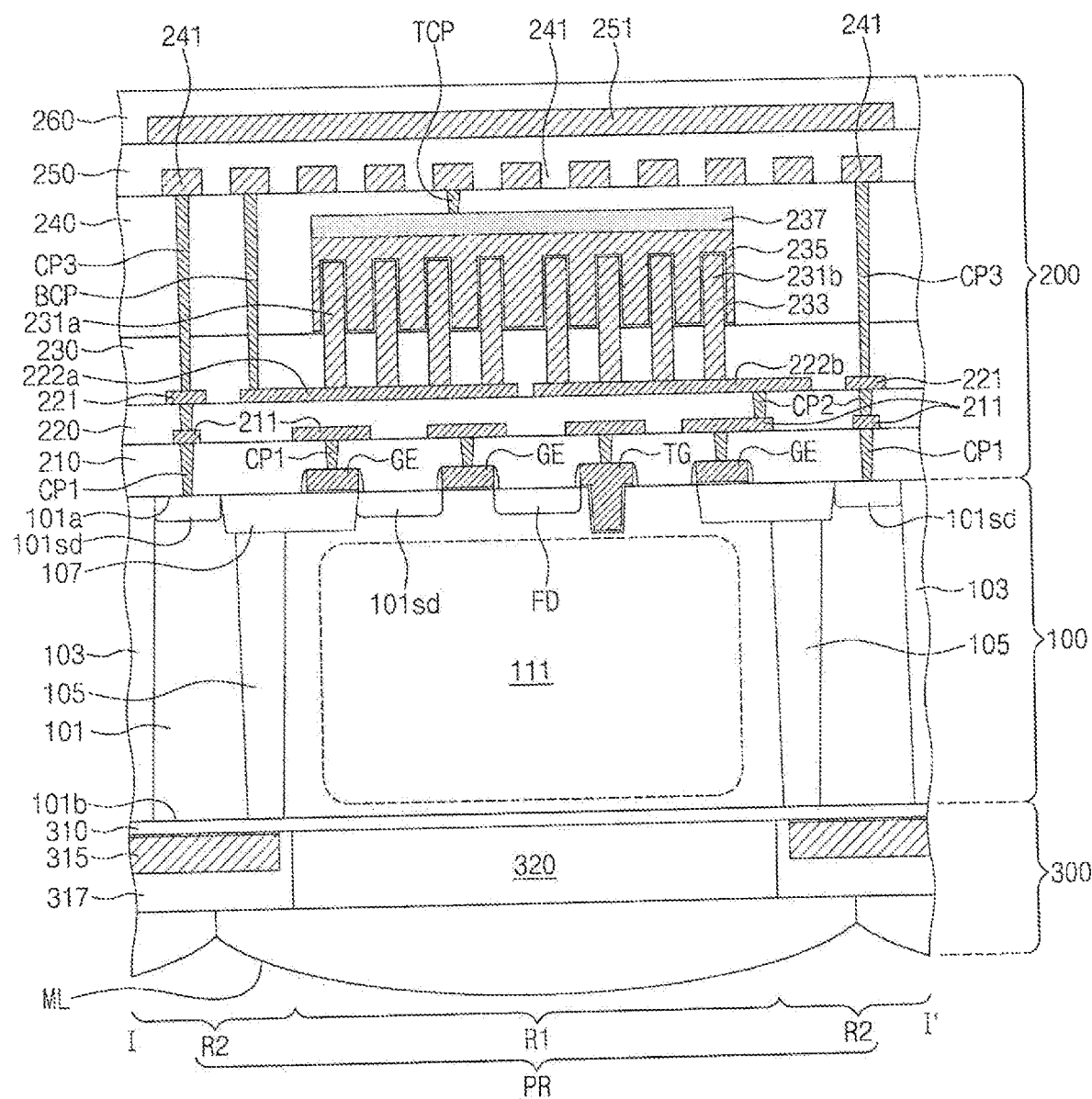
FIG. 9 is a cross-sectional view taken along line I-I' of FIG. 5, illustrating an image sensor according to some embodiments of the inventive concept.

FIG. 9 is a cross-sectional view taken along line I-I' of FIG. 5, illustrating an image sensor according to some embodiments of the inventive concept. Descriptions of the same elements as those of the above described embodiments will be briefly made or omitted.

Referring to FIG. 9, the mold insulation layer 230 may at least partially cover the first and second lower pad electrodes 222a and 222b. The first and second lower electrodes 231a and 231b having a pillar shape may be disposed in the mold insulation layer 230. An upper surface of the mold insulation layer 230 may be positioned at a lower level than upper surfaces of the first and second lower electrodes 231a and 231b.

The dielectric pattern 233 may conformally cover upper portions of the first and second lower electrodes 231a and 231b protruding over the upper surface of the mold insulation layer 230 and may cover the upper surface of the mold insulation layer 230 between respective ones of the first and second lower electrodes 231a and 231b.

The upper electrode 235 may cover a plurality of first and second lower electrodes 231a and 231b, on the dielectric pattern 233 and may at least partially fill spaces between the respective ones of the first and second lower electrodes 231a and 231b. The upper pad electrode 237 may be formed of a conductive material different from that of the upper electrode 235 and may be disposed on the upper electrode 235.

Figure 10A:
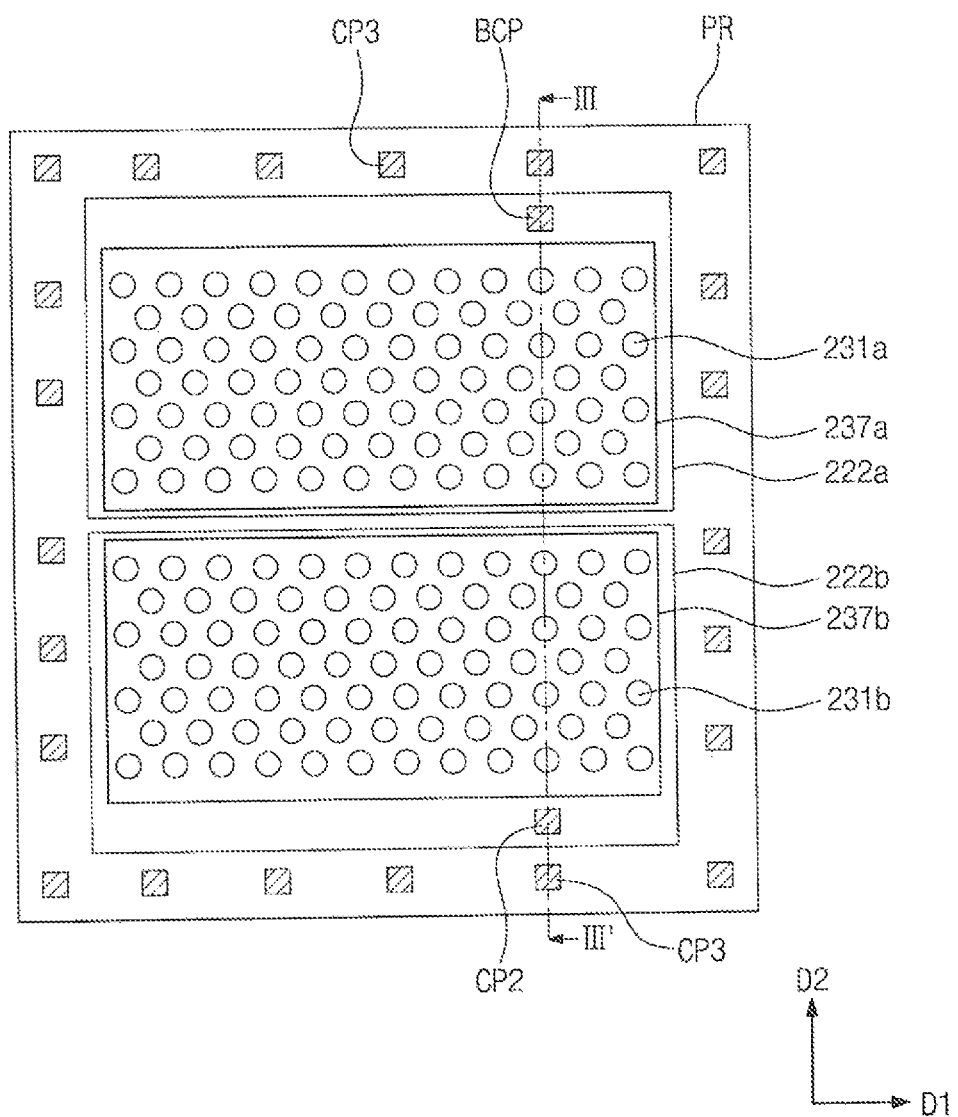
FIG. 10A is a plan view of an image sensor according to some embodiments of the inventive concept.
Figure 10B:
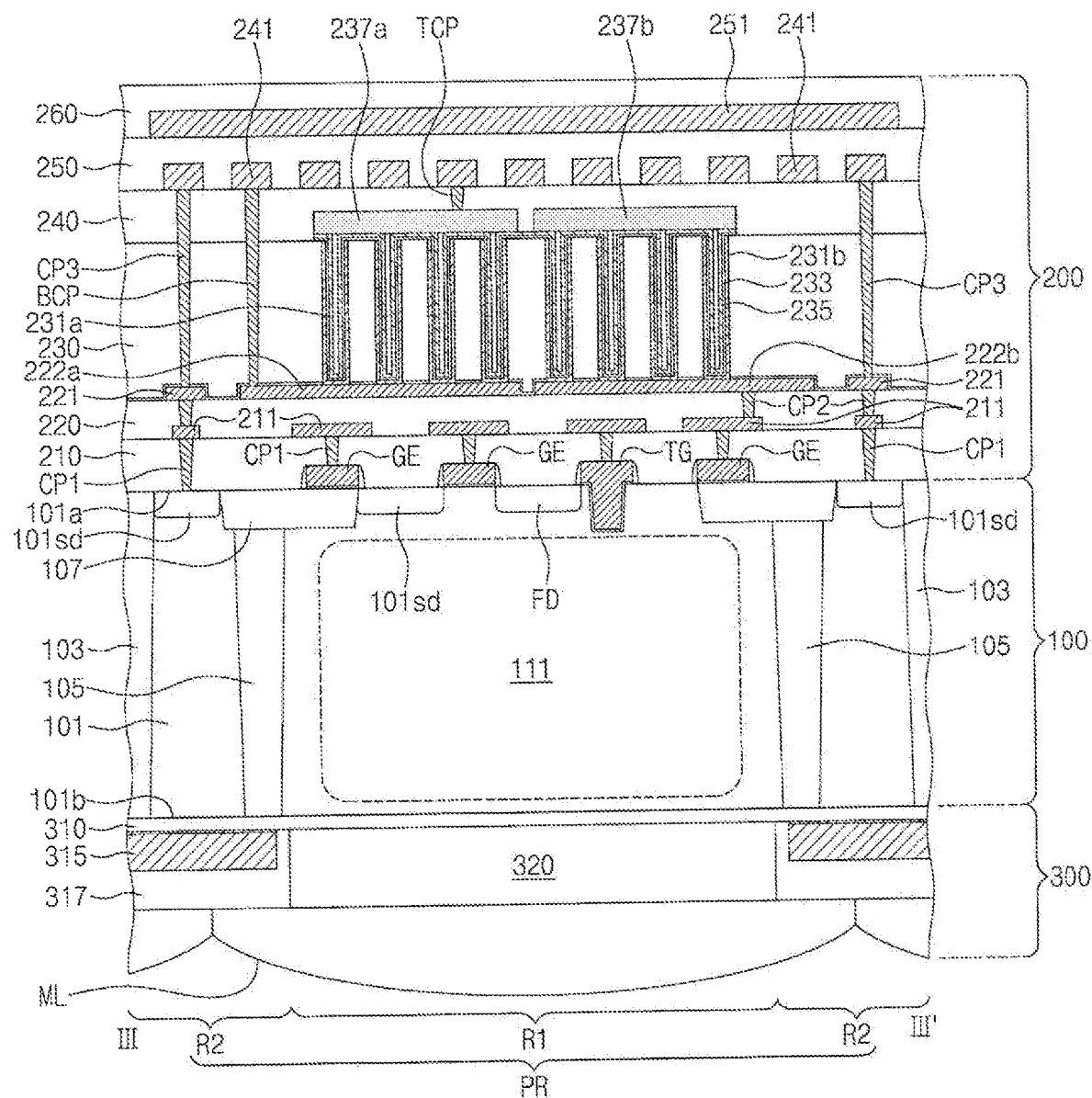
FIG. 10B is a cross-sectional view taken along line III-III' of FIG. 10A.

FIG. 10A is a plan view of an image sensor according to some embodiments of the inventive concept. FIG. 10B is a cross-sectional view taken along line III-III' of FIG. 10A. Descriptions of the same elements as those of the above described embodiments will be briefly made or omitted.

Referring to FIGS. 10A and 10B, the first lower electrodes 231a may be disposed on the first lower pad electrode 222a, and the second lower electrodes 231b may be disposed on the second lower pad electrode 222b.

The dielectric pattern 233 and the upper electrode 235 may at least partially cover the first and second lower electrodes 231a and 231b with a substantially uniform thickness.

Spaced apart first and second upper pad electrodes 237a and 237b may be disposed on the upper electrode 235. As an example, the first upper pad electrode 237a may overlap the first lower pad electrode 222a in plan view, and the second upper pad electrode 237b may overlap the second lower pad electrode 222b in plan view.

The spaced first and second upper pad electrodes 237a and 237b may be electrically commonly connected through the upper contact plugs TCP and the fourth wiring lines 251.

FIGS. 11 to 18 are views illustrating a method of manufacturing an image sensor according to some embodiments of the inventive concept and are cross-sectional views taken along line I-I' of FIG. 5.

Figure 11:
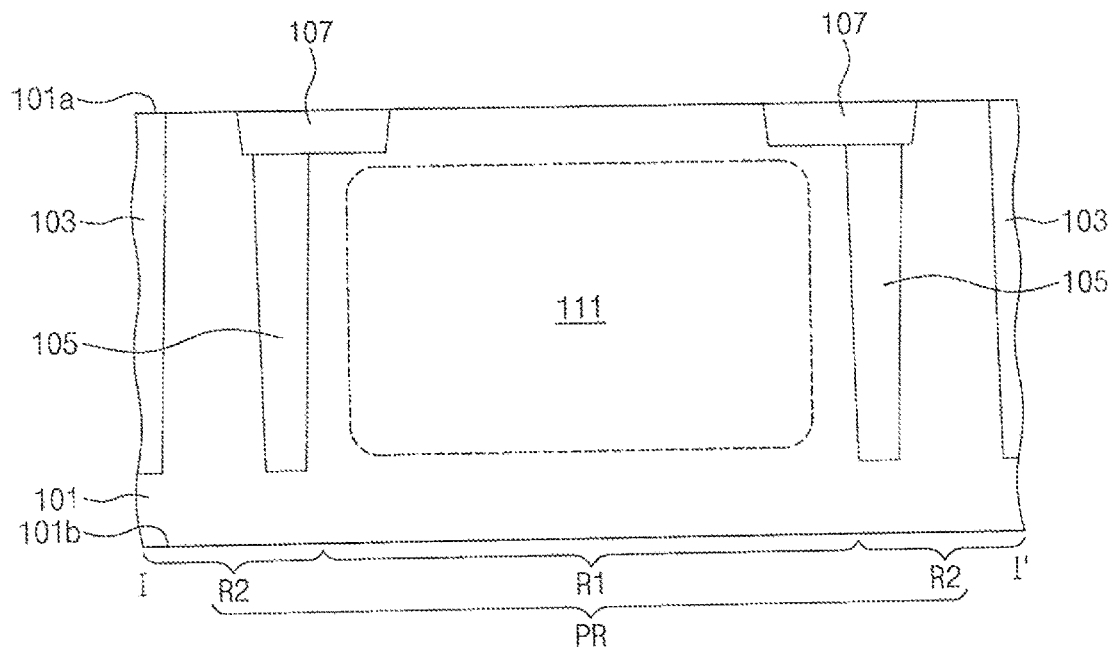
FIGS. 11 to 18 are cross-sectional views taken along line I-I' of FIG. 5 illustrating a method of manufacturing an image sensor according to some embodiments of the inventive concept.

Referring to FIG. 11, the semiconductor substrate 101 of the first conductivity type (e.g., p-type) may be provided. The semiconductor substrate 101 may have the first surface 101a and the second surface 101b opposite to each other. The semiconductor substrate 101 may be a substrate in which an epitaxial layer of the first conductivity type is formed on a bulk silicon substrate of first conductivity type (e.g., p-type). In some embodiments, the semiconductor substrate 101 may be a bulk semiconductor substrate including a well of first conductivity type.

The pixel separation structure 103 defining the pixel regions PR and the isolation structure 105 defining the light receiving region R and the light blocking region R2 in each pixel region PR may be formed in the semiconductor substrate 101.

The pixel separation structure 103 and the isolation structure 105 may be formed by patterning the first surface 101a and/or the second surface 101b of the semiconductor substrate 101 to form a deep trench and then filling the deep trench with an insulating material. The plurality of pixel region PR may be arranged in a matrix form along the first direction D1 and the second direction D2.

The photoelectric conversion region 111 may be formed in the semiconductor substrate 101 of the light receiving region R1. The photoelectric conversion region 111 may be formed by forming a mask having openings, which each correspond to the light receiving region R1 of each pixel PR, on the first surface 101a of the semiconductor substrate 101 and doping an impurity of the second conductivity type (e.g., n-type) different from the first conductivity type into the semiconductor substrate 101 using the mask. The mask may be removed after the formation of the photoelectric conversion region 111. Before or after the formation of the photoelectric conversion region 111, a well region of the first conductivity type may be formed adjacent to the first surface 101a of the semiconductor substrate 101.

The device isolation layer 107 may be formed in the semiconductor substrate 101 in each pixel region PR adjacent to the first surface 101a of the semiconductor substrate 101 to define active regions. The device isolation layer 107 may be formed by patterning the first surface 101a of the semiconductor substrate 101 to form a shallow trench and then depositing an insulation material in the shallow trench.

Figure 12:
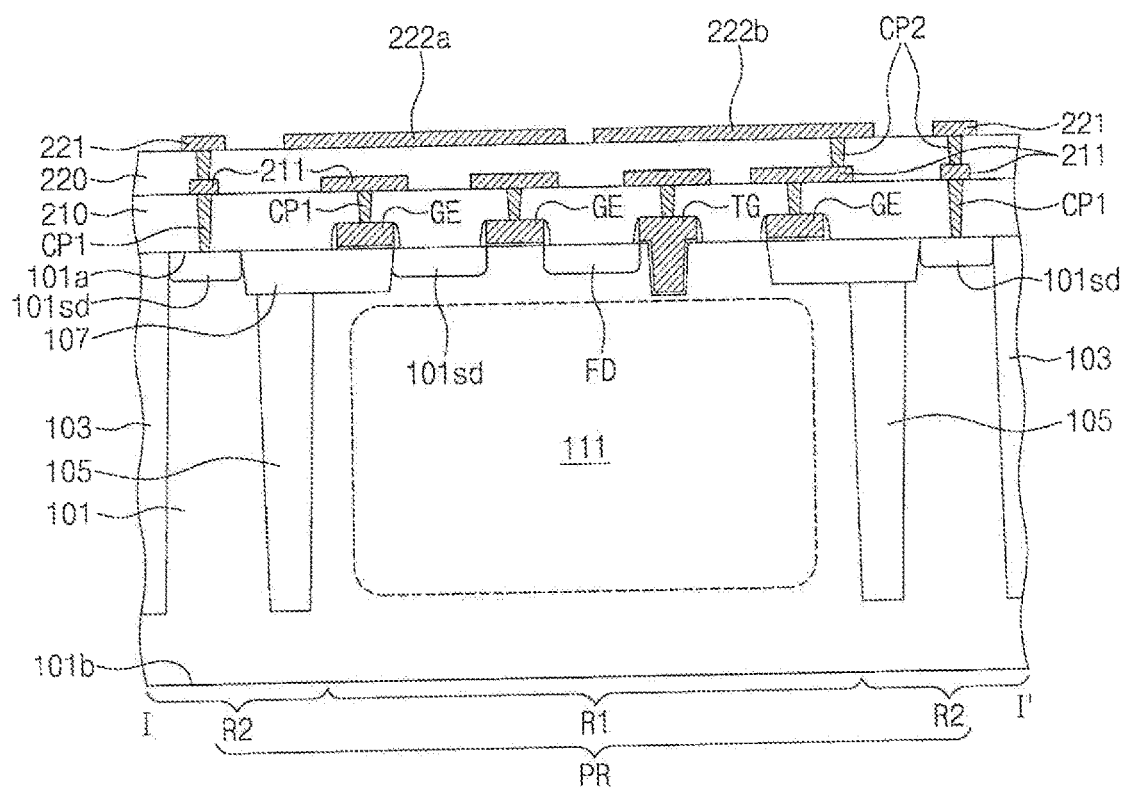

Referring to FIG. 12, the MOS transistors constituting the unit pixel may be formed on the first surface 101a of the semiconductor substrate 101.

The gate electrodes TG and GE of the MOS transistors may be formed on the first surface 101a of the semiconductor substrate 101. The gate electrodes TG and GE may be formed by patterning the first surface 101a of the semiconductor substrate 101 to form a gate recess region in each pixel region PR, forming a gate insulation layer to conformally cover the first surface 101a of the semiconductor substrate 101 and an inner surface of the gate recess region, forming a gate conductive layer to at least partially fill the gate recess region, and patterning the gate conductive layer. The transfer gate TG among the gate electrodes may be formed in a recess region formed by patterning the first surface 101a of the semiconductor substrate 101.

After the formation of the gate electrodes TG and GE, the floating diffusion region FD and the source/drain impurity regions 101sd may be formed in the semiconductor substrate 101 at sides of the gate electrodes TG and GE. The floating diffusion region FD and the source/drain impurity regions 101sd may be formed by implanting the second conductivity type impurity.

The first interlayer insulation layer 210 may be formed on the first surface 101a of the semiconductor substrate 101. The first interlayer insulation layer 210 may at least partially cover the gate electrodes TG and GE of the MOS transistors. The first contact plugs CP1 connected to the MOS transistors may be formed in the first interlayer insulation layer 210. The first wiring lines 211 may be formed on the first interlayer insulation layer 210 so as to be connected to the first contact plugs CP1.

The second interlayer insulation layer 220 may be formed on the first interlayer insulation layer 210 to at least partially cover the first wiring lines 211. The second wiring lines 221 and the first and second lower pad electrodes 222a and 222b may be formed on the second interlayer insulation layer 220.

The second wiring lines 221 and the first and second lower pad electrodes 222a and 222b may be formed by depositing a metal layer on the second interlayer insulation layer 220 and then patterning the metal layer.

Figure 13:
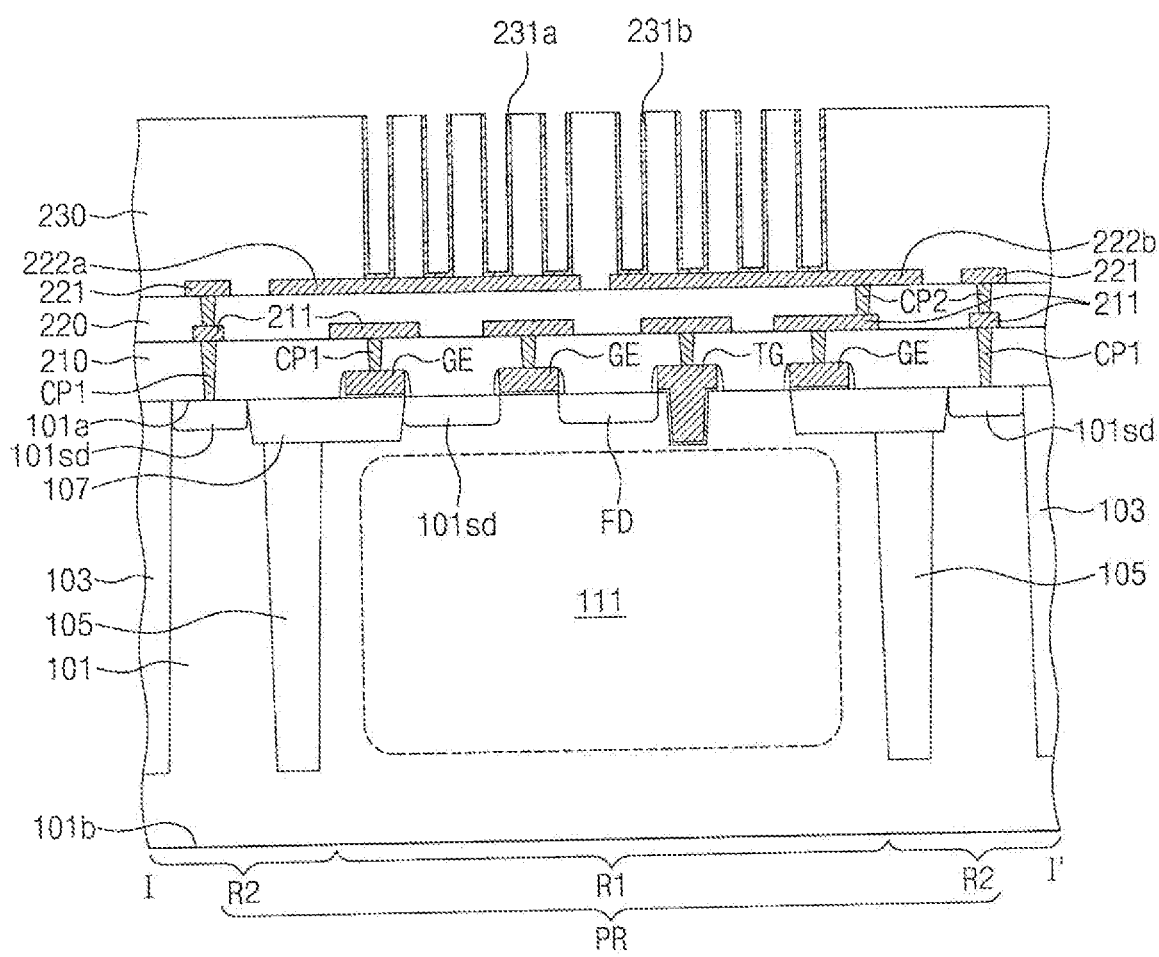

Referring to FIG. 13, the mold insulation layer 230 may be formed on the second interlayer insulation layer 220 to at least partially cover the second wiring lines 221 and the first and second lower pad electrodes 222a and 222b.

The mold insulation layer 230 may be formed of silicon oxide. In some embodiments, before the formation of the mold insulation layer 230, an etch stop layer having an etch selectivity with respect to the mold insulation layer 230 may be formed.

When the first and second lower electrodes 231a and 231b are formed, a height of the first and second lower electrodes 231a and 231b may vary based on a thickness of the mold insulation layer 230. The capacitance of the first and second capacitors may be adjusted based on the height and the number of the first and second lower electrodes 231a and 231b. As the height of the first and second lower electrodes 231a and 231b increases, the capacitance of the capacitors may be increased. Thus, the mold insulation layer 230 may be formed to a desired thickness so as to increase the capacitances of the capacitors to desired values.

After the formation of the mold insulation layer 230, a process of forming lower electrode holes may be performed. The lower electrode holes may be formed by forming a mask pattern on the mold insulation layer 230 and anisotropically etching the mold insulation layer 230 using the mask pattern as an etch mask to expose the first and second lower pad electrodes 222a and 222b. The lower electrode holes may be arranged in a zigzag pattern or a honeycomb shape.

After a lower electrode layer is deposited to conformally at least partially cover a surface of the mold insulation layer 230 having the lower electrode holes, the lower electrode layer may be planarized to expose an upper surface of the mold insulation layer 230, such that the first and second lower electrodes 231a and 231b may be formed in the lower electrode holes, respectively.

Each of the first and second lower electrodes 231a and 231b may have a cylinder shape having a bottom portion contacting a correspond one of the first and second lower pad electrodes 222a and 222b and a sidewall portion extending from both ends of the bottom portion.

Figure 14:
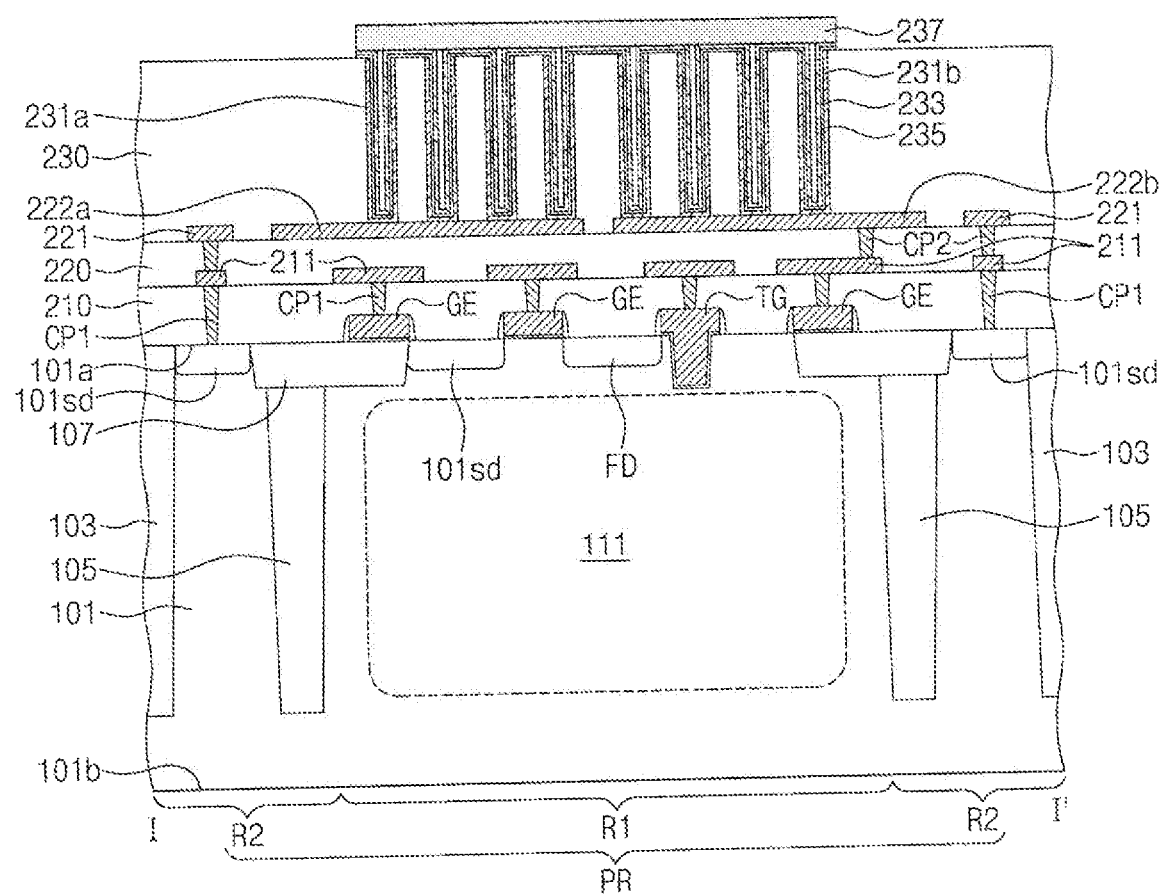

Referring to FIG. 14, a dielectric layer and an upper electrode layer may be formed on the first and second lower electrodes 231a and 231b.

The dielectric layer and the upper electrode layer may be formed using a film-forming technology with a high step coverage property, such as chemical vapor deposition, physical vapor deposition, or atomic layer deposition.

The dielectric layer and the upper electrode layer may at least partially cover surfaces of the first and second lower electrodes 231a and 231b in the lower electrode holes and may extend onto the upper surface of the mold insulation layer 230. The upper electrode layer may define a gap region (refer to G of FIG. 7) in the lower electrode holes. In some embodiments, the upper electrode layer may completely fill the lower electrode holes having the first and second lower electrodes 231a and 231b and the dielectric layer.

An upper pad conductive layer may be formed on the upper electrode layer, and the upper pad conductive layer may be patterned to form the upper pad electrode 237. The upper pad conductive layer may be formed by depositing a different conductive material from the upper electrode layer. The upper pad conductive layer may be an impurity doped silicon germanium layer, for example.

After the formation of the upper pad electrode 237, the upper electrode layer and the dielectric layer may be sequentially etched, such that the dielectric pattern 233 and the upper electrode 235 may be formed.

Figure 15:
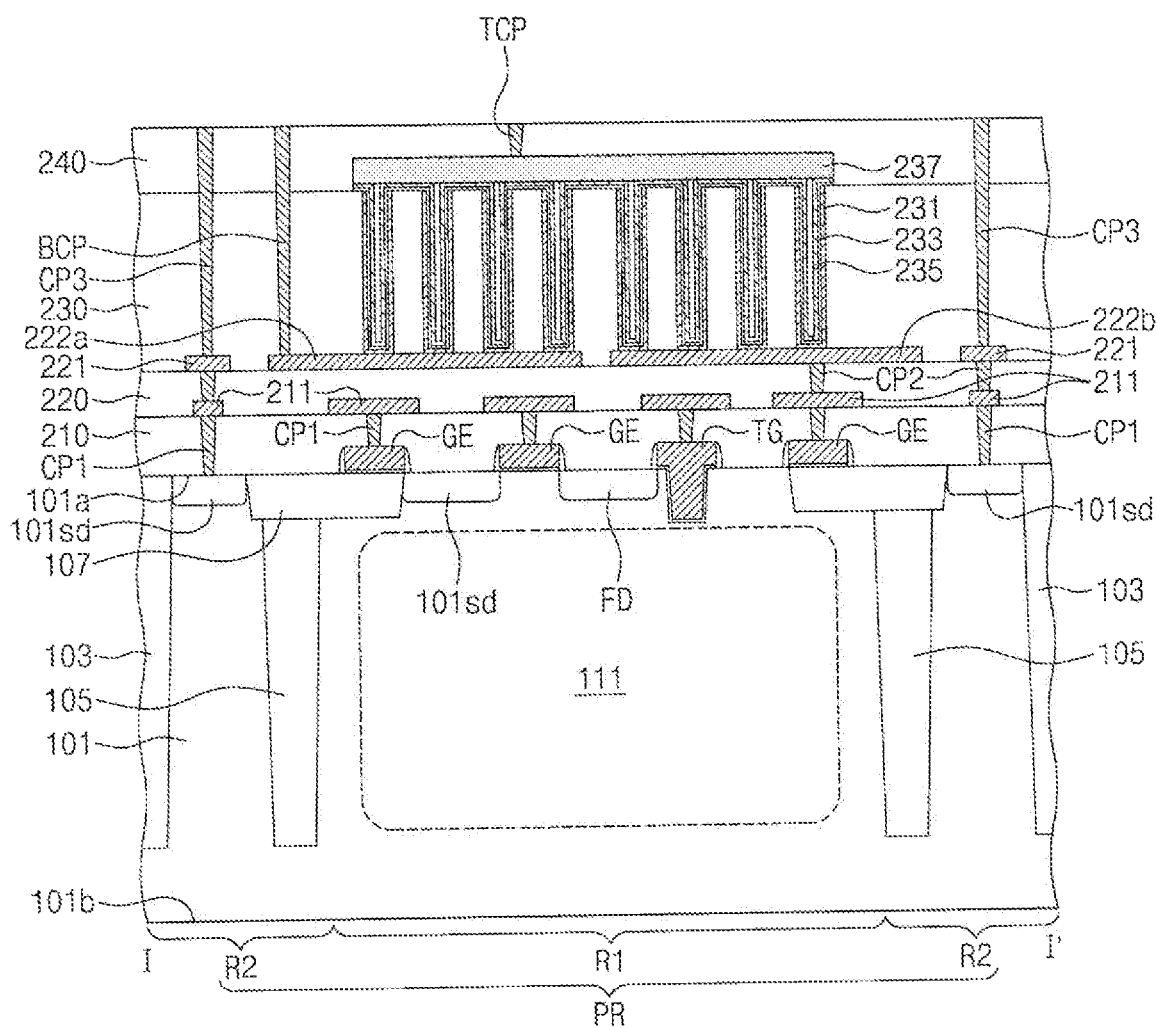

Referring to FIG. 15, the third interlayer insulation layer 240 may be formed on the mold insulation layer 230 to at least partially cover the upper pad electrode 237.

The third contact plugs CP3 and the lower contact plug BCP that penetrate the third interlayer insulation layer 240 and the mold insulation layer 230 and the upper contact plugs TCP penetrating the mold insulation layer 230 may be substantially simultaneously formed.

The formation of the third contact plugs CP3, the lower contact plug BCP, and the upper contact plugs TCP may include forming a mask pattern on the third interlayer insulation layer 240, anisotropically etching the third interlayer insulation layer 240 and the mold insulation layer 230 to form a first contact hole exposing the second wiring line 221, a second contact hole exposing the first lower pad electrode 222a, and third contact holes exposing the upper pad electrode 237, and at least partially filling the first, second, and third contact holes with a conductive material. The upper pad electrode 237 may inhibit or prevent the upper electrode 235 from being etched during the formation of the first to third contact holes. When the third contact holes are formed, a portion of an upper surface of the upper pad electrode 237 may be recessed.

The at least partially filling of the first and second contact holes with the conductive material may include sequentially depositing a barrier metal layer and a metal layer in the first, second, and third contact holes and planarizing the barrier metal layer and the metal layer to expose an upper surface of the third interlayer insulation layer 240.

The third contact plugs CP3, the lower contact plug BCP, and the upper contact plugs TCP may include, for example, aluminum, tungsten, titanium, molybdenum, tantalum, titanium nitride, tantalum nitride, zirconium nitride, tungsten nitride, or a combination thereof.

Figure 16:
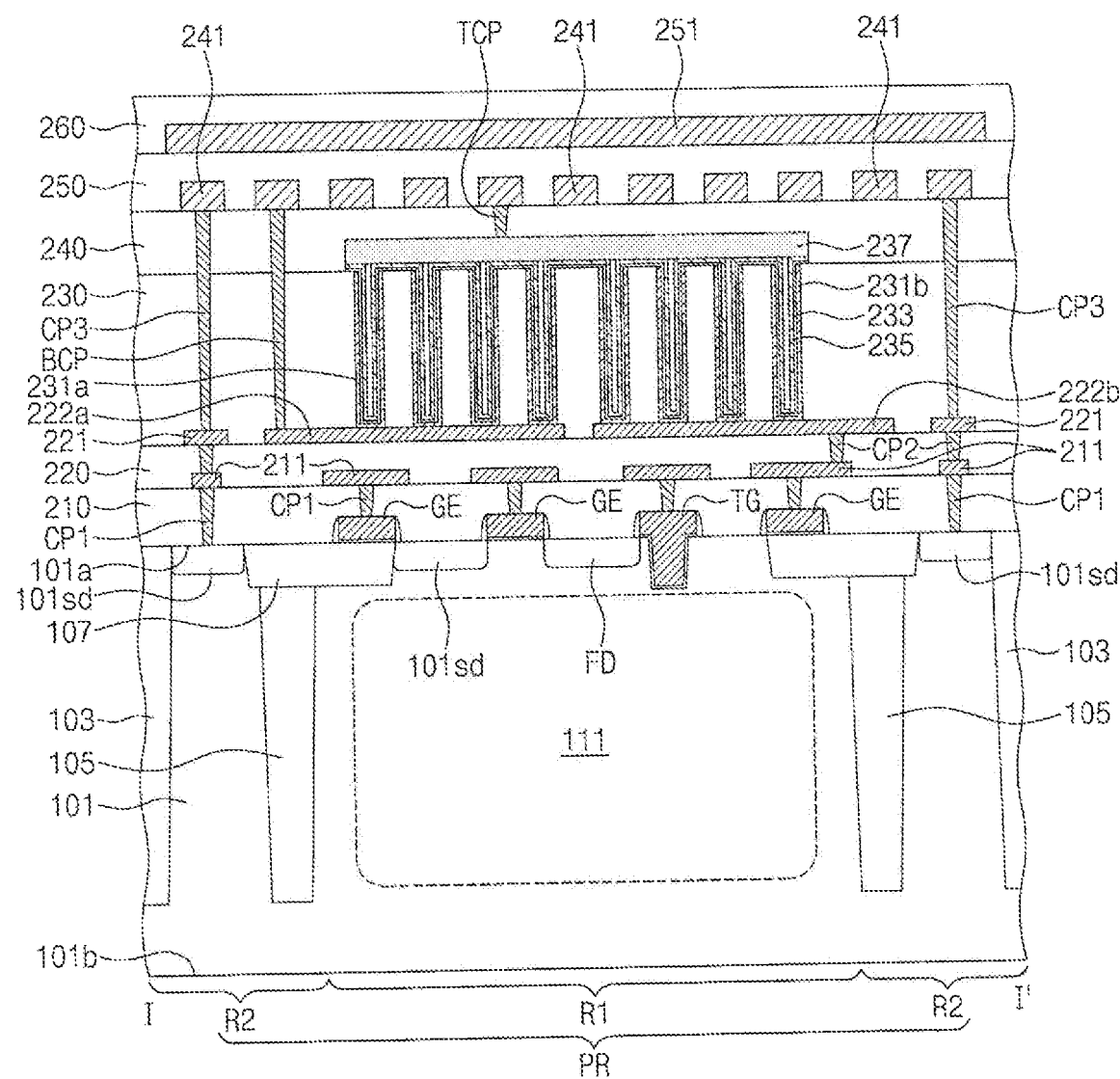

Referring to FIG. 16, the third wiring lines 241 may be formed on the third interlayer insulation layer 240, and the fourth interlayer insulation layer 250 may be formed on the third interlayer insulation layer 240 to at least partially cover the third wiring lines 241. The third wiring lines 241 may be formed of a metal material having a resistivity less than that of the third contact plugs CP3, the lower contact plug BCP, and the upper contact plugs TCP. The third wiring lines 241 may be formed in the fourth interlayer insulation layer 250 by depositing a metal layer and patterning the metal layer, or performing a damascene process.

The third wiring lines 241 may have a linear shape or a bar shape. One of the third wiring lines 241 may be connected to the upper pad electrode 237 through the lower contact plugs TCP. Another of the third wiring lines 241 may be connected to the first lower pad electrode 222a through the lower contact plug BCP.

The fourth wiring lines 251 may be formed on the fourth interlayer insulation layer 250, and the fifth interlayer insulation layer 260 may be formed on the fourth interlayer insulation layer 250 to at least partially cover the fourth wiring lines 251. The fourth wiring lines 251 may include the same metal material as the third wiring lines 241.

Figure 17:
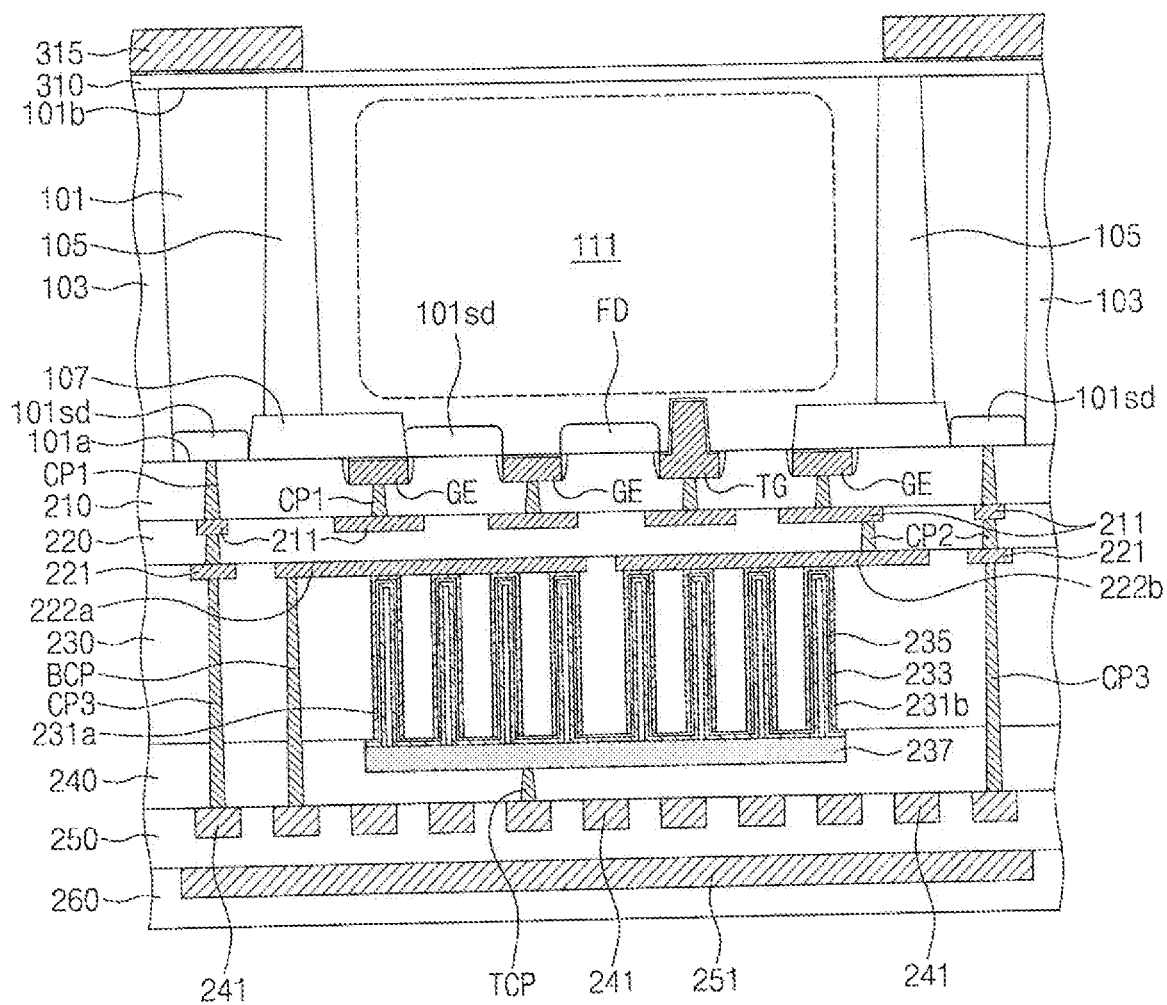

Referring to FIG. 17, a thinning process of removing a portion of the semiconductor substrate 101 may be performed to reduce a vertical thickness of the semiconductor substrate 101. The thinning process may include grinding or polishing the second surface 101b of the semiconductor substrate 101 and isotropically or anisotropically etching the resultant structure. A top and bottom of the semiconductor substrate 101 may be reversed to make the semiconductor substrate 101 thinner (to perform the thinning process). A portion of the semiconductor substrate 101 may be removed by the grinding or polishing process, and then the isotropic and/or anisotropic etch process may be performed to remove surface defects of the semiconductor substrate 101.

As the thinning process is performed on the second surface 101b of the semiconductor substrate 101, surfaces of the pixel separation structure 103 and the isolation structure 105 may be exposed. The exposed surfaces of the pixel separation structure 103 and the isolation structure 105 may be substantially coplanar with the second surface 101b of the semiconductor substrate 101.

The planarized insulation layer 310 may be formed on the second surface 101b of the semiconductor substrate 101. The planarized insulation layer 310 may at least partially cover the surfaces of the pixel separation structure 103 and the isolation structure 105. The planarized insulation layer 310 may be formed by depositing a metal oxide, such as aluminum oxide and/or hafnium oxide.

The light blocking pattern 315 may be formed on the planarized insulation layer 310 in the light blocking region R2. The light blocking pattern 315 may be formed by depositing a metal layer and then patterning the metal layer.

Figure 18:
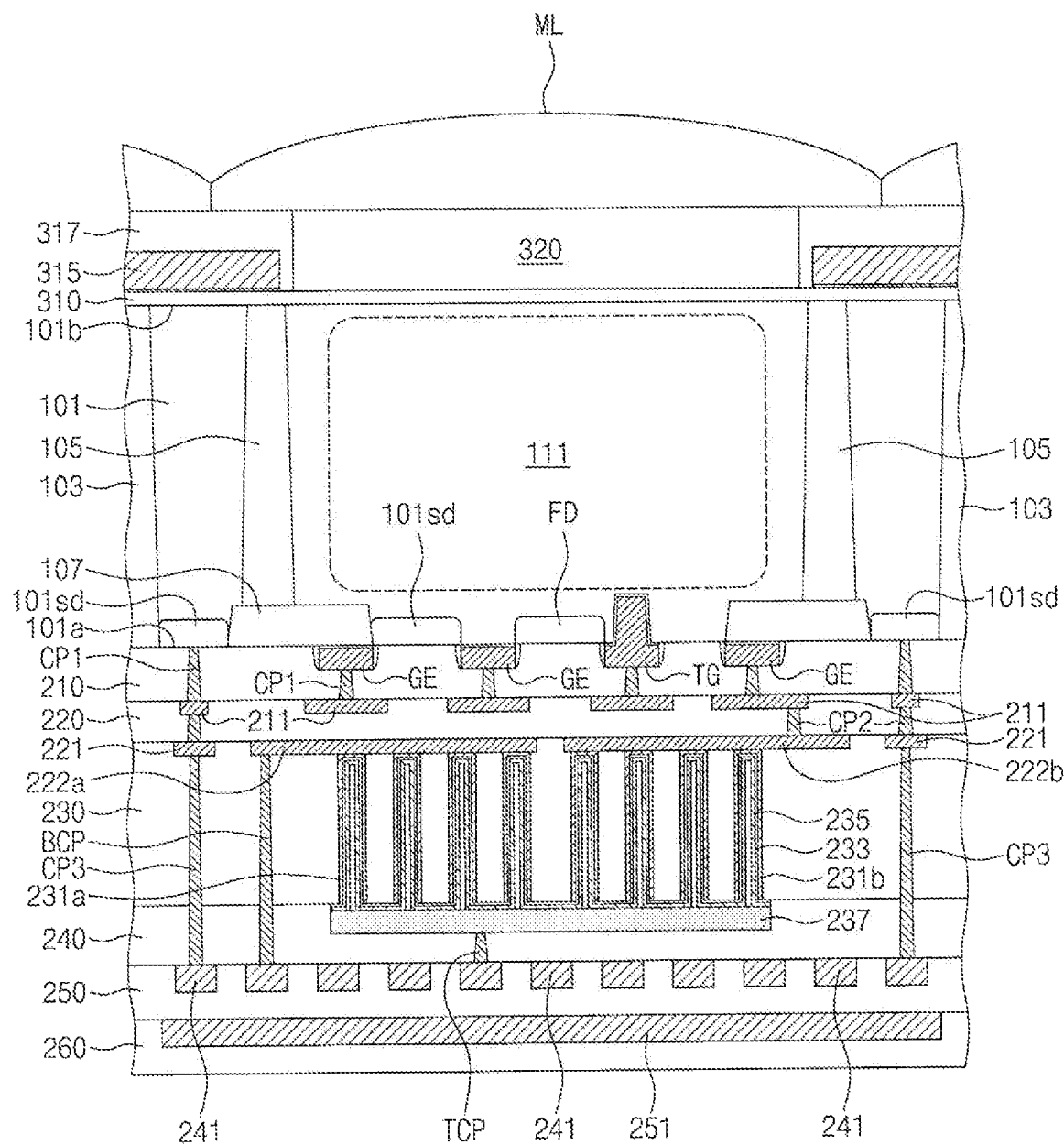

Referring to FIG. 18, the buffer insulation layer 317 may be formed to at least partially cover the light blocking pattern 315 and may expose the planarized insulation layer 310 in the light receiving region R1.

The light filter layer 320 may be formed, on the planarized insulation layer 310, corresponding to each light receiving region R1. The light filter layer 320 may include blue, green, or red color filters, or an infrared filter. The microlens ML may be formed on the light filter layer 320 in the light receiving region R1.

According to example embodiments, because the capacitance of the capacitor on the photoelectric conversion device may increase, the shutter efficiency operation may be enhanced during the global shutter.

The optical signal generated from the photoelectric conversion device may be stored in the capacitor until the optical signal is output as the image signal. Thus, the loss of the photoelectric charges or generation of noise may be reduced until before the pixel signal is output from the unit pixel As the capacitor is disposed on the photoelectric conversion device, the area occupying ratio (i.e., fill factor) of the photoelectric conversion device in each unit pixel may be increased.

Furthermore, even though the cell size of the unit pixel is reduced, the aspect ratio and surfaces of the lower electrodes may increase, such that the capacitance of the capacitor may be maintained at a desired value.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:
1. An image sensor comprising:
a semiconductor substrate having a first surface and a second surface opposite to the first surface;
a photoelectric conversion layer in the semiconductor substrate;
transistors on the first surface of the semiconductor substrate;
a first interlayer insulation layer on the transistors;

a first lower pad electrode and a second lower pad electrode spaced apart from the first lower pad electrode on the first interlayer insulation layer;
a mold insulation layer on the first and second lower pad electrodes;
a plurality of first lower electrodes in the mold insulation layer, the plurality of first lower electrodes on the first lower pad electrode;
a plurality of second lower electrodes in the mold insulation layer, the plurality of second lower electrodes on the second lower pad electrode;
a dielectric layer on the first and second lower electrodes;
an upper electrode on the dielectric layer; and
an upper pad electrode connected to the upper electrode,
wherein the first lower electrodes are arranged on the first lower pad electrode in a zigzag pattern, and
wherein the second lower electrodes are arranged on the second lower pad electrode in a zigzag pattern.

2. The image sensor according to claim 1, wherein the upper pad electrode comprises a different conductive material from the first and second lower pad electrodes, and the upper pad electrode comprises a different conductive material from the upper electrode.

3. The image sensor according to claim 1, wherein the upper pad electrode comprises an impurity doped semiconductor material.

4. The image sensor according to claim 1, wherein the upper pad electrode is thicker than each of the first and second lower pad electrodes.

5. The image sensor according to claim 1, further comprising:
a second interlayer insulation layer on the mold insulation layer and on the upper pad electrode;
a plurality of upper contact plugs extending through the second interlayer insulation layer and connected to the upper pad electrode; and
a lower contact plug extending through the second interlayer insulation layer and the mold insulation layer and connected to the first lower pad electrode;
wherein the plurality of upper contact plugs comprise a same first metal material as the lower contact plug.

6. The image sensor according to claim 5, further comprising a plurality of conductive lines on the second interlayer insulation layer,
wherein the plurality of conductive lines are connected to the transistors, the plurality of upper contact plugs, and the lower contact plug and comprise a second metal material having less resistivity than the first metal material.

7. The image sensor according to claim 1, wherein each of the first and second lower electrodes comprises a bottom portion and a sidewall portion extending from the bottom portion to define an empty space, and
wherein the dielectric layer and the upper electrode extend along inner surfaces of the first and second lower electrodes.

8. The image sensor according to claim 7, wherein the upper pad electrode contacts portions of the upper electrode on the mold insulation layer.

9. The image sensor according to claim 1, wherein the first and second lower pad electrodes overlap the photoelectric conversion layer in plan view.

10. The image sensor according to claim 1, further comprising:
a pixel separation structure in the semiconductor substrate, the pixel separation structure defining a pixel region; and
an isolation structure in the semiconductor substrate in the pixel region, the isolation structure defining a light receiving region and a light blocking region,
wherein the photoelectric conversion layer is in the light receiving region.

11. The image sensor according to claim 1, further comprising:
a microlens on the second surface of the semiconductor substrate; and
a light filter between the microlens and the semiconductor substrate.

12. An image sensor comprising:
a semiconductor substrate having a first surface and a second surface opposite to the first surface;
a photoelectric conversion layer in the semiconductor substrate;
transistors on the first surface of the semiconductor substrate;
a first interlayer insulation layer on the transistors;
first wiring lines comprising a first metal material on the first interlayer insulation layer, the first wiring lines connected to the transistors;
a mold insulation layer on the first wiring lines;
a capacitor in the mold insulation layer, the capacitor connected to the transistors;
a second interlayer insulation layer on the capacitor; and
second wiring lines comprising a second metal material on the second interlayer insulation layer, the second wiring lines connected to the first wiring lines and the capacitor,
wherein the second metal material of the second wiring lines has less resistivity than the first metal material of the first wiring lines.

13. The image sensor according to claim 12, wherein the first wiring lines comprise a first lower pad electrode and a second lower pad electrode spaced apart from the first lower pad electrode, and
wherein the capacitor comprises:
a plurality of first lower electrodes on the first lower pad electrode;
a plurality of second lower electrodes on the second lower pad electrode;
an upper electrode on the first and second lower electrodes; and
a dielectric layer between the upper electrode and the first and second lower electrodes.

14. The image sensor according to claim 13, further comprising an upper pad electrode contacting the upper electrode, the upper pad electrode comprising an impurity doped semiconductor material.

15. The image sensor according to claim 14, further comprising:
a lower contact plug in the mold insulation layer and the second interlayer insulation layer, the lower contact plug connecting the first lower pad electrode to one of the second wiring lines; and
an upper contact plug in the second interlayer insulation layer, the upper contact plug connecting the upper pad electrode to another of the second wiring lines,
wherein the upper contact plug comprises a same metal material as the lower contact plug.

16. The image sensor according to claim 14, wherein the second lower pad electrode is connected to one of the first wiring lines through a contact plug in the first interlayer insulation layer.

17. An image sensor comprising:
a semiconductor substrate having a first surface and a second surface opposite to the first surface;
a pixel separation structure in the semiconductor substrate, the pixel separation structure defining a plurality of pixel regions;
a photoelectric conversion layer in the semiconductor substrate in each of the plurality of pixel regions;
transistors on the first surface of the semiconductor substrate;
a first interlayer insulation layer on the transistors; and
a first capacitor and a second capacitor on the first interlayer insulation layer, the first and second capacitors overlapping the photoelectric conversion layer in each of the plurality of pixel regions;
wherein the first capacitor comprises a plurality of first lower electrodes, and
wherein the second capacitor comprises a plurality of second lower electrodes,
wherein the first lower electrodes are arranged in a zigzag pattern, and
wherein the second lower electrodes are arranged in a zigzag pattern.

18. The image sensor according to claim 17, wherein the first capacitor further comprises a first lower pad electrode on the first interlayer insulation layer in each of the plurality of pixel regions, an upper electrode on the plurality of first lower electrodes, and a dielectric layer between the upper electrode and the plurality of first lower electrodes, and
wherein the second capacitor further comprises a second lower pad electrode on the first interlayer insulation layer in each of the plurality of pixel regions, the upper electrode on the plurality of second lower electrodes, and the dielectric layer between the upper electrode and the plurality of second lower electrodes.

19. The image sensor according to claim 18, further comprising:
first wiring lines on the first interlayer insulation layer, the first wiring lines connected to the transistors;
a second interlayer insulation layer on the first and second capacitors; and
second wiring lines on the second interlayer insulation layer,
wherein the first lower pad electrode is connected to one of the second wiring lines through an upper contact plug extending through the second interlayer insulation layer, and
wherein the second lower pad electrode is connected to one of the first wiring lines through a lower contact plug extending through the first interlayer insulation layer.

* * * * *